(12) United States Patent
Fritz et al.

(10) Patent No.: US 10,240,058 B2
(45) Date of Patent: Mar. 26, 2019

(54) REACTIVELY ASSISTED INK FOR PRINTED ELECTRONIC CIRCUITS

(71) Applicant: The Charles Stark Draper Laboratory, Inc., Cambridge, MA (US)

(72) Inventors: Gregory M. Fritz, Acton, MA (US); Sara Barron, Braintree, MA (US)

(73) Assignee: The Charles Stark Draper Laboratory, Inc., Cambridge, MA (US)

(*) Notice: Subject to any disclaimer, the term of this patent is extended or adjusted under 35 U.S.C. 154(b) by 0 days.

(21) Appl. No.: 15/969,496

(22) Filed: May 2, 2018

(65) Prior Publication Data
US 2018/0251652 A1    Sep. 6, 2018

Related U.S. Application Data

(63) Continuation of application No. 15/835,012, filed on Dec. 7, 2017.

(60) Provisional application No. 62/434,255, filed on Dec. 14, 2016.

(51) Int. Cl.
| | |
|---|---|
| C09D 11/52 | (2014.01) |
| H05K 1/09 | (2006.01) |
| C09D 11/30 | (2014.01) |
| C09D 11/54 | (2014.01) |
| H01L 23/532 | (2006.01) |
| H05K 3/10 | (2006.01) |
| H05K 3/12 | (2006.01) |
| H01L 23/498 | (2006.01) |

(52) U.S. Cl.
CPC .............. *C09D 11/52* (2013.01); *C09D 11/30* (2013.01); *C09D 11/54* (2013.01); *H01L 23/49883* (2013.01); *H01L 23/532* (2013.01); *H05K 1/09* (2013.01); *H05K 1/092* (2013.01); *H05K 3/10* (2013.01); *H05K 3/12* (2013.01); *H01L 23/5328* (2013.01)

(58) Field of Classification Search
None
See application file for complete search history.

(56) References Cited

U.S. PATENT DOCUMENTS

| | | | |
|---|---|---|---|
| 7,115,161 | B2 | 10/2006 | Magdassi et al. |
| 7,963,646 | B2 | 6/2011 | Magdassi et al. |
| 8,163,077 | B2 | 4/2012 | Eron et al. |
| 8,227,022 | B2 | 7/2012 | Magdassi et al. |
| 2001/0004477 | A1 | 6/2001 | Fukunaga et al. |

(Continued)

FOREIGN PATENT DOCUMENTS

WO    WO 2005/078158    8/2005

OTHER PUBLICATIONS

DuPont USA, "Screen Printed Inks for Printed Circuit Boards," http://www.dupont.com/products-and-services/electronic-electrical-materials/printed-circuit-board-materials/brands/screen-printed-inks-for-pcb.html, 2 pages, Oct. 18, 2016.

(Continued)

*Primary Examiner* — Katie L. Hammer
(74) *Attorney, Agent, or Firm* — Sunstein Kann Murphy & Timbers LLP

(57) ABSTRACT

An ink contains particles containing metal that reacts during sintering to produce an electrically conductive line or area having a diffusivity that is less than the diffusivity of the metal before the reaction. Resulting electronic circuits therefore exhibit longer useful lives, compared to conventionally inkjet printed circuits.

19 Claims, 12 Drawing Sheets

(56) References Cited

U.S. PATENT DOCUMENTS

| | | | |
|---|---|---|---|
| 2003/0148024 A1 | 8/2003 | Kodas et al. | |
| 2003/0180451 A1 | 9/2003 | Kodas et al. | |
| 2003/0213402 A1 | 11/2003 | Magdassi et al. | |
| 2004/0140197 A1 | 7/2004 | Watanabe et al. | |
| 2005/0034791 A1 | 2/2005 | Lee et al. | |
| 2005/0078158 A1 | 4/2005 | Magdassi et al. | |
| 2006/0001726 A1 | 1/2006 | Kodas et al. | |
| 2006/0159838 A1* | 7/2006 | Kowalski | B82Y 30/00 427/58 |
| 2006/0163744 A1 | 7/2006 | Vanheusden et al. | |
| 2007/0128905 A1 | 6/2007 | Speakman | |
| 2008/0193667 A1 | 8/2008 | Garbar et al. | |
| 2009/0214766 A1 | 8/2009 | Magdassi et al. | |
| 2009/0214840 A1 | 8/2009 | Eron et al. | |
| 2010/0068409 A1 | 3/2010 | Garbar et al. | |
| 2010/0167023 A1* | 7/2010 | Oyanagi | C09D 11/322 428/195.1 |
| 2010/0265307 A1* | 10/2010 | Linton | C09D 11/326 347/100 |
| 2011/0021592 A1 | 1/2011 | Magdassi et al. | |
| 2011/0135734 A1 | 6/2011 | Magdassi et al. | |
| 2011/0183128 A1 | 7/2011 | Magdassi et al. | |
| 2012/0056341 A1 | 3/2012 | Magdassi et al. | |
| 2012/0091401 A1* | 4/2012 | Hotta | B22F 1/0022 252/513 |
| 2012/0168684 A1 | 7/2012 | Magdassi et al. | |
| 2012/0241693 A1 | 9/2012 | Magdassi et al. | |
| 2013/0209368 A1 | 8/2013 | Magdassi et al. | |
| 2014/0102605 A1 | 4/2014 | Fritz et al. | |
| 2014/0161971 A1 | 6/2014 | Kasai | |
| 2014/0290987 A1 | 10/2014 | Yang et al. | |
| 2014/0300695 A1 | 10/2014 | Smalley et al. | |
| 2015/0056426 A1 | 2/2015 | Grouchko et al. | |
| 2015/0366073 A1 | 12/2015 | Magdassi et al. | |
| 2018/0163071 A1 | 6/2018 | Fritz et al. | |

OTHER PUBLICATIONS

Fischer, et al., "A survey of combustible metals, thermites, and intermetallics for pyrotechnic applications," AIAA, Meeting Papers on Disc, 14 pages, Jul. 1996.

Geng, "Three-dimensional display technologies," Advances in Optics and Photonics 5, pp. 456-535, 2013.

Kulick, et al., "Partial Pixels: A Three-Dimensional Diffractive Display Architecture," Opt. Soc. Am. A., vol. 12, No. 1, 15 pages, Jan. 1995.

Lienig, "Electromigration and Its Impact on Physical Design in Future Technologies," Dresden University of Technology, ACM Intn'l Symp. on Physical Design (ISPD), pp. 33-40, 2013.

Matteo, et al., "Collinear Guided Wave to Leaky Wave Acoustooptic Interactions in Proton-Exchanged LiNbO$_3$ Waveguides," IEEE Transactions on Ultrasonics, Ferroelectrics, and Frequency Control, vol. 47, No. 1, pp. 16-28, Jan. 2000.

McLaughlin, et al., "Optimized guided-to-leaky-mode device for graphics processing unit controlled frequency division of color," Applied Optics, vol. 54, No. 12, pp. 3732-3736, Apr. 20, 2015.

Methode Electronics, Inc., "Conductive & Resistive Inks," http://www.methode.com/sensors-and-switches/conductive-and-resistive-inks.html#.WlfLU5owuUK, product information, 3 pages, retrieved online Dec. 5, 2016.

Nano Dimension, "AgCite Highly Conductive Silver Inks for Printed Electronics," product brochure, 2 pages, Oct. 2016.

Nano Dimension, "Nanoparticle Conductive & Dielectric Inks," http://www.nano-di.com/conductive-inks, 3 pages, retrieved online Dec. 2, 2016.

Nano Dimension, "3D Printed Electronics," http://www.nano-di.com/, 4 pages, retrieved online Dec. 2, 2016.

Numula, et al., "Reactive Current-Activated Tip-Based Sintering of Ni—Al Intermetallics," Metallogr. Microstruct. Anal., vol. 2, pp. 148-155, 2013.

Onural, et al., "New high-resolution display device for holographic three-dimensional video: principles and simulations," Optical Engineering, vol. 33, No. 3, pp. 835-844, Mar. 1994.

Pan, et al., "A Review of Dynamic Holographic ThreeDimensional Display: Algorithms, Devices, and Systems," IEEE Transactions on Industrial Informatics, vol. 12, No. 4, pp. 1599-1610, Aug. 2016.

Qaderi, et al., "Leaky-mode waveguide modulators with high deflection angle for use in holographic video displays," Optics Express, vol. 24, No. 18, 11 pages, Sep. 2016.

Roy "Thermal Management of a Novel iUHD-Technology Based MCM," http://www.imaps.org/abstracts/system/new/abstract_preview.asp?abstract=10therm016, 1 page, abstract, 2010.

Savidis, et al., "Fabrication of waveguide spatial light modulators via femtosecond laser micromachining," Proc. SPIE 9759, Advanced Fabrication Technologies for Micro/Nano Optics and Photonics IX, 12 pages, Mar. 2016.

Smalley, et al., "Anisotropic leaky-mode modulator for holographic video displays," Nature, vol. 498, 6 pages, Jun. 20, 2013.

Song, et al., "Nanoscale Joule Heating and Electromigration Enhanced Ripening of Silver Nanowire Contacts," ACS Nano, vol. 8, No. 3, pp. 2804-2811, 2014.

Wargo, "Characterization of Conductors for Printed Electronics," PChem Associates, www.nanopchem.com, 12 pages, Aug. 2016.

Wikipedia, "Electromigration," https://en.wikipedia.org/w/index.php?title=Electromigration&oldid=747083922, 9 pages, Oct. 31, 2016.

Wikipedia, "Nickel aluminide," https://en.wikipedia.org/w/index.php?title=Nickel_aluminide&oldid=720658973, 3 pages, May 17, 2016.

Wikipedia, "Rendering (computer graphics)," https://en.wikipedia.org/w/index.php?title=Rendering_(computer_graphics)&oldid=752571928, Dec. 2, 2016, 12 pages.

International Searching Authority, Israel Patent Office, International Search Report and Written Opinion, International Application No. PCT/US2017/065143, 15 pages, dated Apr. 8, 2018.

* cited by examiner

REACTIVELY ASSISTED INK FOR PRINTED ELECTRONIC CIRCUITS

CROSS REFERENCE TO RELATED APPLICATIONS

This application is a continuation of U.S. patent application Ser. No. 15/835,012, filed Dec. 7, 2017, titled "Reactively Assisted Ink for Printed Electronic Circuits," which claims the benefit of U.S. Provisional Patent Application No. 62/434,255, filed Dec. 14, 2016, titled "Reactively Assisted Ink for Printed Electronic Circuits," the entire contents of each of which are hereby incorporated by reference herein, for all purposes.

TECHNICAL FIELD

The present invention relates to electrically conductive inks and, more particularly, to reactively assisted conductive inks for printing printed circuit boards (PCBs), conformal electronic circuits and other printed electronic circuits.

BACKGROUND ART

Inkjet printing of conductive inks onto flexible or rigid substrates, such as paper, polyester, synthetic polymer sheets, acrylic, polyimide, glass or FR-4, to create printed electronic circuits has made fabricating prototypes and finished electronic products significantly faster than by conventional lithographic etched circuit board fabrication. One of two basic techniques is typically used to deposit the ink onto the substrate: drop-on-demand (DOD), such as from piezo- or bubble-driven jets, or continuous spray, such as a shear thinning ink that is constantly deposited as a viscous ink onto either a substrate or itself to form a free-standing wire. In many contexts, the inks are made electrically conductive by the inclusion of metallic, such as silver, microparticles or nanoparticles.

Once deposited on a substrate, the particles should be sintered, i.e., fused into a solid mass, to provide electrical and mechanical connections between the particles. In some cases, high temperatures, such as about 300° C., are used to sinter the particles. The particles are sintered to consolidate the particles, for mechanical stability, and to form metal-to-metal electrically conductive junctions among the particles, thereby forming an end-to-end electrically conductive line or area.

However, many substrates or components mounted on the substrates are incompatible with such high temperatures. Thus, in other cases, so-called "non-thermal sintering" is used to fuse, bind or otherwise electrically join the conductive particles together. For example, U.S. Pat. No. 7,963,646 to Shlomo Magdassi ("Magdassi"), the entire contents of which are hereby incorporated by reference herein for all purposes, describes ink formulations and inkjet printing techniques. Magdassi prints two layers: a metallic ink layer and a solution of flocculant. Alternatively, Magdassi prints the metallic ink on a substrate that has been pre-treated with the flocculant.

Nevertheless, silver inks are limited in their current carrying capacity, often to less than 1,000 Amps per square centimeter ($A/cm^2$). At the current density of most circuits consisting of copper wiring ("traces"), which is about 10,000 $A/cm^2$, circuits fabricated using silver inks typically degrade after short times, often within weeks of fabrication, as a result of electromigration of silver atoms. Higher current carrying capacities and longer lived electric circuits created with conductive inks would be highly desirable and would enable new applications for printed conductors.

SUMMARY OF EMBODIMENTS

An embodiment of the present invention provides an ink. The ink includes a plurality of particles dispersed in a carrier fluid. At least some of the particles include a first metal having a first diffusivity. At least some of the particles include a substance with which the first metal is chemically reactive to produce a product during a chemical reaction. The product is electrically conductive and has a second diffusivity that is less than the first diffusivity.

In some embodiments, the at least some of the particles that include the first metal also include the substance. In other embodiments, the at least some of the particles that include the first metal are distinct from the at least some of the particles that include the substance. In yet other embodiments, some of the particles that include the first metal also include the substance, and other of the particles that include the first metal do not include any of the substance.

The first diffusivity may be greater than about 1E-30 $cm^2/s$ at 25° C.

The first diffusivity may include a first propensity to electromigrate.

The second diffusivity may be less than about 1E-25 $cm^2/s$ at 25° C.

The second diffusivity may be at least about 100 times less than the first diffusivity.

Resistivity of the product may be less than about 500 $\mu\Omega$-cm.

The product may remain entirely solid up to at least about 300° C.

The first metal may have has a thermal stability. The product may have a thermal stability greater than the thermal stability of the first metal. The first metal may have an electrical stability. The product may have an electrical stability greater than the electrical stability of the first metal.

The chemical reaction may be exothermic.

The first metal may include one or more of: Cu, Al, Ag, Au, Pd, Pt, Si, Ti, Zr, Rh, Ir, Os, Ta, Mg, Ru, Fe, Ni, Co and/or C; and/or an oxide of Cu, Al, Ag, Au, Pd, Pt, Si, Ti, Zr, Rh, Ir, Os, Ta, Mg, Ru, Fe, Ni, Co and/or C; and/or a nitride of Cu, Al, Ag, Au, Pd, Pt, Si, Ti, Zr, Rh, Ir, Os, Ta, Mg, Ru, Fe, Ni, Co and/or C; and/or a phosphide of Cu, Al, Ag, Au, Pd, Pt, Si, Ti, Zr, Rh, Ir, Os, Ta, Mg, Ru, Fe, Ni, Co and/or C.

The product may include an intermetallic of Cu, Al, Ag, Au, Pd, Pt, Si, Ti, Zr, Rh, Ir, Os, Ta, Mg, Ru, Fe, Ni, Co and/or C; and/or a solid solution of Cu, Al, Ag, Au, Pd, Pt, Si, Ti, Zr, Rh, Ir, Os, Ta, Mg, Ru, Fe, Ni, Co and/or C.

The substance may include a second metal, different from the first metal.

The substance may include a non-metal.

Each particle may include at least three alternating layers of the first metal and the second metal.

Each particle may include a matrix of the first metal and the second metal.

The first metal may include Al. The second metal may include Cu. The product may include $CuAl_2$.

Each particle may have a respective shape. The shape may be or include: flake, plate, cube, sphere, irregular, cylinder and/or trough.

At least some of the particles may include a coating. The coating may include a material having a diffusivity greater than about 1E-30 $cm^2/s$ at 25° C.

The coating may include Al or Ag.

At least some of the particles may include a third metal. The third metal may be different from the first metal. The third metal may be different from the second metal. The third metal may be chemically reactive with the first metal to produce at least a portion of the product during the chemical reaction.

At least some of the particles may include a third metal. The third metal may be different from the first metal. The third metal may be different from the second metal. The third metal may have a diffusivity greater than about 1E-30 cm$^2$/s at 25° C.

The third metal may include Al and/or Ag.

The ink may also include an exothermic reactive mixture. The exothermic reactive mixture may be other than the first metal and other than the substance. The exothermic reactive mixture may be dispersed in the carrier fluid.

The exothermic reactive mixture may include Al and Pd. The exothermic reactive mixture may include Al and Ni.

Another embodiment of the present invention provides a method for making an ink. The method includes dispersing a plurality of particles in a carrier fluid. At least some of the particles include a first metal. The first metal has a first diffusivity. At least some of the particles include a substance with which the first metal is chemically reactive to produce a product during a chemical reaction. The product is electrically conductive. The product has a diffusivity that is less than the first diffusivity.

In some embodiments, the at least some of the particles that include the first metal also include the substance. In other embodiments, the at least some of the particles that include the first metal are distinct from the at least some of the particles that include the substance. In yet other embodiments, some of the particles that include the first metal also include the substance, and other of the particles that include the first metal do not include any of the substance.

The first diffusivity may be greater than about 1E-30 cm$^2$/s at 25° C.

The first diffusivity may include a first propensity to electromigrate.

The second diffusivity may be less than about 1E-25 cm$^2$/s at 25° C.

The second diffusivity may be at least about 100 times less than the first diffusivity.

Resistivity of the product may be less than about 500 µΩ-cm.

The product may remain entirely solid up to at least about 300° C.

The first metal may have has a thermal stability. The product may have a thermal stability greater than the thermal stability of the first metal. The first metal may have an electrical stability. The product may have an electrical stability greater than the electrical stability of the first metal.

The chemical reaction may be exothermic.

The first metal may include one or more of: Cu, Al, Ag, Au, Pd, Pt, Si, Ti, Zr, Rh, Ir, Os, Ta, Mg, Ru, Fe, Ni, Co and/or C; and/or an oxide of Cu, Al, Ag, Au, Pd, Pt, Si, Ti, Zr, Rh, Ir, Os, Ta, Mg, Ru, Fe, Ni, Co and/or C; and/or a nitride of Cu, Al, Ag, Au, Pd, Pt, Si, Ti, Zr, Rh, Ir, Os, Ta, Mg, Ru, Fe, Ni, Co and/or C; and/or a phosphide of Cu, Al, Ag, Au, Pd, Pt, Si, Ti, Zr, Rh, Ir, Os, Ta, Mg, Ru, Fe, Ni, Co and/or C.

The product may include an intermetallic of Cu, Al, Ag, Au, Pd, Pt, Si, Ti, Zr, Rh, Ir, Os, Ta, Mg, Ru, Fe, Ni, Co and/or C; and/or a solid solution of Cu, Al, Ag, Au, Pd, Pt, Si, Ti, Zr, Rh, Ir, Os, Ta, Mg, Ru, Fe, Ni, Co and/or C.

The substance may include a second metal, different from the first metal.

The substance may include a non-metal.

Each particle may include at least three alternating layers of the first metal and the second metal.

Each particle may include a matrix of the first metal and the second metal.

The first metal may include Al. The second metal may include Cu. The product may include CuAl$_2$.

Each particle may have a respective shape. The shape may be or include: flake, plate, cube, sphere, irregular, cylinder and/or trough.

At least some of the particles may include a coating. The coating may include a material having a diffusivity greater than about 1E-30 cm$^2$/s at 25° C.

The coating may include Al or Ag.

At least some of the particles may include a third metal. The third metal may be different from the first metal. The third metal may be different from the second metal. The third metal may be chemically reactive with the first metal to produce at least a portion of the product during the chemical reaction.

At least some of the particles may include a third metal. The third metal may be different from the first metal. The third metal may be different from the second metal. The third metal may have a diffusivity greater than about 1E-30 cm$^2$/s at 25° C.

The third metal may include Al and/or Ag.

The ink may also include an exothermic reactive mixture. The exothermic reactive mixture may be other than the first metal and other than the substance. The exothermic reactive mixture may be dispersed in the carrier fluid.

The exothermic reactive mixture may include Al and Pd. The exothermic reactive mixture may include Al and Ni.

Yet another embodiment of the present invention provides an ink kit. The ink kit includes a first ink and a second ink. The first ink includes a plurality of first particles dispersed in a first carrier fluid. Each first particle of the plurality of first particles includes a first metal having a first diffusivity. The second ink is separate from the first ink. The second ink includes a plurality of second particles dispersed in a second carrier fluid. Each second particle of the plurality of second particles includes a substance with which the first metal is chemically reactive to produce a product during a chemical reaction. The product is electrically conductive. The product has a second diffusivity that is less than the first diffusivity.

The first diffusivity may be greater than about 1E-30 cm$^2$/s at 25° C.

The first diffusivity may include a first propensity to electromigrate.

The second diffusivity may be less than about 1E-25 cm$^2$/s at 25° C.

The second diffusivity may be at least about 100 times less than the first diffusivity.

Resistivity of the product may be less than about 500 µΩ-cm.

The product may remain entirely solid up to at least about 300° C.

The first metal may have has a thermal stability. The product may have a thermal stability greater than the thermal stability of the first metal. The first metal may have an electrical stability. The product may have an electrical stability greater than the electrical stability of the first metal.

The chemical reaction may be exothermic.

The first metal may include one or more of: Cu, Al, Ag, Au, Pd, Pt, Si, Ti, Zr, Rh, Ir, Os, Ta, Mg, Ru, Fe, Ni, Co and/or C; and/or an oxide of Cu, Al, Ag, Au, Pd, Pt, Si, Ti, Zr, Rh, Ir, Os, Ta, Mg, Ru, Fe, Ni, Co and/or C; and/or a nitride of Cu, Al, Ag, Au, Pd, Pt, Si, Ti, Zr, Rh, Ir, Os, Ta, Mg, Ru, Fe, Ni, Co and/or C; and/or a phosphide of Cu, Al, Ag, Au, Pd, Pt, Si, Ti, Zr, Rh, Ir, Os, Ta, Mg, Ru, Fe, Ni, Co and/or C.

The product may include an intermetallic of Cu, Al, Ag, Au, Pd, Pt, Si, Ti, Zr, Rh, Ir, Os, Ta, Mg, Ru, Fe, Ni, Co and/or C; and/or a solid solution of Cu, Al, Ag, Au, Pd, Pt, Si, Ti, Zr, Rh, Ir, Os, Ta, Mg, Ru, Fe, Ni, Co and/or C.

The substance may include a second metal, different from the first metal.

The substance may include a non-metal.

The first metal may include Al. The second metal may include Cu. The product may include $CuAl_2$.

Each particle may have a respective shape. The shape may be or include: flake, plate, cube, sphere, irregular, cylinder and/or trough.

At least some of the particles may include a coating. The coating may include a material having a diffusivity greater than about 1E-30 $cm^2/s$ at 25° C.

The coating may include Al or Ag.

At least some of the first or second particles may include a third metal. The third metal may be different from the first metal. The third metal may be different from the second metal. The third metal may be chemically reactive with the first metal to produce at least a portion of the product during the chemical reaction.

At least some of the first particles may include a third metal. The third metal may be different from the first metal. The third metal may be different from the second metal. The third metal may have a diffusivity greater than about 1E-30 $cm^2/s$ at 25° C.

The third metal may include Al and/or Ag.

The ink may also include an exothermic reactive mixture. The exothermic reactive mixture may be other than the first metal and other than the substance. The exothermic reactive mixture may be dispersed in the first or second carrier fluid.

The exothermic reactive mixture may include Al and Pd. The exothermic reactive mixture may include Al and Ni.

Another embodiment of the present invention provides a method for making an ink. The method includes dispersing a plurality of particles in at least one carrier fluid. At least some of the particles include a first metal. The first metal has a first diffusivity. At least some of the particles include a substance with which the first metal is chemically reactive to produce a product during a chemical reaction. The plurality of particles that include the first metal and the plurality of particles that include the substance may both be dispersed in one carrier fluid. Alternatively, the plurality of particles that includes the first metal and the plurality of particles that includes the substance may be dispersed in separate carrier fluids. The product is electrically conductive. The product has a diffusivity that is less than the first diffusivity.

Another embodiment of the present invention provides a method for making an ink kit. The method includes providing a first ink and providing a second ink. The second ink is separate from the first ink. Providing the first ink includes dispersing a plurality of first particles in a first carrier fluid. Each first particle of the plurality of first particles includes a first metal having a first diffusivity. Providing the second ink includes dispersing a plurality of second particles in a second carrier fluid. Each second particle of the plurality of second particles includes a substance with which the first metal is chemically reactive to produce a product during a chemical reaction. The product is electrically conductive. The product has a second diffusivity that is less than the first diffusivity.

The first diffusivity may be greater than about 1E-30 $cm^2/s$ at 25° C.

The first diffusivity may include a first propensity to electromigrate.

The second diffusivity may be less than about 1E-25 $cm^2/s$ at 25° C.

The second diffusivity may be at least about 100 times less than the first diffusivity.

Resistivity of the product may be less than about 500 μΩ-cm.

The product may remain entirely solid up to at least about 300° C.

The first metal may have has a thermal stability. The product may have a thermal stability greater than the thermal stability of the first metal. The first metal may have an electrical stability. The product may have an electrical stability greater than the electrical stability of the first metal.

The chemical reaction may be exothermic.

The first metal may include one or more of: Cu, Al, Ag, Au, Pd, Pt, Si, Ti, Zr, Rh, Ir, Os, Ta, Mg, Ru, Fe, Ni, Co and/or C; and/or an oxide of Cu, Al, Ag, Au, Pd, Pt, Si, Ti, Zr, Rh, Ir, Os, Ta, Mg, Ru, Fe, Ni, Co and/or C; and/or a nitride of Cu, Al, Ag, Au, Pd, Pt, Si, Ti, Zr, Rh, Ir, Os, Ta, Mg, Ru, Fe, Ni, Co and/or C; and/or a phosphide of Cu, Al, Ag, Au, Pd, Pt, Si, Ti, Zr, Rh, Ir, Os, Ta, Mg, Ru, Fe, Ni, Co and/or C.

The product may include an intermetallic of Cu, Al, Ag, Au, Pd, Pt, Si, Ti, Zr, Rh, Ir, Os, Ta, Mg, Ru, Fe, Ni, Co and/or C; and/or a solid solution of Cu, Al, Ag, Au, Pd, Pt, Si, Ti, Zr, Rh, Ir, Os, Ta, Mg, Ru, Fe, Ni, Co and/or C.

The substance may include a second metal, different from the first metal.

The substance may include a non-metal.

The first metal may include Al. The second metal may include Cu. The product may include $CuAl_2$.

Each particle may have a respective shape. The shape may be or include: flake, plate, cube, sphere, irregular, cylinder and/or trough.

At least some of the particles may include a coating. The coating may include a material having a diffusivity greater than about 1E-30 $cm^2/s$ at 25° C.

The coating may include Al or Ag.

At least some of the first or second particles may include a third metal. The third metal may be different from the first metal. The third metal may be different from the second metal. The third metal may be chemically reactive with the first metal to produce at least a portion of the product during the chemical reaction.

At least some of the first particles may include a third metal. The third metal may be different from the first metal. The third metal may be different from the second metal. The third metal may have a diffusivity greater than about 1E-30 $cm^2/s$ at 25° C.

The third metal may include Al and/or Ag.

The ink may also include an exothermic reactive mixture. The exothermic reactive mixture may be other than the first metal and other than the substance. The exothermic reactive mixture may be dispersed in the first or second carrier fluid.

The exothermic reactive mixture may include Al and Pd. The exothermic reactive mixture may include Al and Ni.

Yet another embodiment of the present invention provides a method for fabricating an electric conductor. The method includes applying an ink to a substrate. The ink includes a plurality of particles dispersed in a carrier fluid. At least some of the particles include a first metal having a first diffusivity. At least some of the particles include a substance with which the first metal is chemically reactive to produce a product during a chemical reaction. The product is electrically conductive. The product has a second diffusivity that is less than the first diffusivity. The first metal is reacted with the substance, according to the chemical reaction, to produce the product on the substrate.

Reacting the first metal may include applying energy to at least a portion of the ink on the substrate, without heating the entire substrate.

Applying the energy may include heating the at least the portion of the ink on the substrate.

Applying the energy may include illuminating the at least the portion of the ink on the substrate with a light source, such as a laser or a lamp.

Applying the energy may include passing an electric current through the at least the portion of the ink on the substrate.

The method may also include providing a substrate that includes a material, different from the first metal, with which the first metal is chemically reactive to produce the product during the chemical reaction.

In some embodiments, the at least some of the particles that include the first metal also include the substance. In other embodiments, the at least some of the particles that include the first metal are distinct from the at least some of the particles that include the substance. In yet other embodiments, some of the particles that include the first metal also include the substance, and other of the particles that include the first metal do not include any of the substance.

The first diffusivity may be greater than about 1E-30 $cm^2/s$ at 25° C.

The first diffusivity may include a first propensity to electromigrate.

The second diffusivity may be less than about 1E-25 $cm^2/s$ at 25° C.

The second diffusivity may be at least about 100 times less than the first diffusivity.

Resistivity of the product may be less than about 500 $\mu\Omega$-cm.

The product may remain entirely solid up to at least about 300° C.

The first metal may have has a thermal stability. The product may have a thermal stability greater than the thermal stability of the first metal. The first metal may have an electrical stability. The product may have an electrical stability greater than the electrical stability of the first metal.

The chemical reaction may be exothermic.

The first metal may include one or more of: Cu, Al, Ag, Au, Pd, Pt, Si, Ti, Zr, Rh, Ir, Os, Ta, Mg, Ru, Fe, Ni, Co and/or C; and/or an oxide of Cu, Al, Ag, Au, Pd, Pt, Si, Ti, Zr, Rh, Ir, Os, Ta, Mg, Ru, Fe, Ni, Co and/or C; and/or a nitride of Cu, Al, Ag, Au, Pd, Pt, Si, Ti, Zr, Rh, Ir, Os, Ta, Mg, Ru, Fe, Ni, Co and/or C; and/or a phosphide of Cu, Al, Ag, Au, Pd, Pt, Si, Ti, Zr, Rh, Ir, Os, Ta, Mg, Ru, Fe, Ni, Co and/or C.

The product may include an intermetallic of Cu, Al, Ag, Au, Pd, Pt, Si, Ti, Zr, Rh, Ir, Os, Ta, Mg, Ru, Fe, Ni, Co and/or C; and/or a solid solution of Cu, Al, Ag, Au, Pd, Pt, Si, Ti, Zr, Rh, Ir, Os, Ta, Mg, Ru, Fe, Ni, Co and/or C.

The substance may include a second metal, different from the first metal.

The substance may include a non-metal.

Each particle may include at least three alternating layers of the first metal and the second metal.

Each particle may include a matrix of the first metal and the second metal.

The first metal may include Al. The second metal may include Cu. The product may include $CuAl_2$.

Each particle may have a respective shape. The shape may be or include: flake, plate, cube, sphere, irregular, cylinder and/or trough.

At least some of the particles may include a coating. The coating may include a material having a diffusivity greater than about 1E-30 $cm^2/s$ at 25° C.

The coating may include Al or Ag.

At least some of the particles may include a third metal. The third metal may be different from the first metal. The third metal may be different from the second metal. The third metal may be chemically reactive with the first metal to produce at least a portion of the product during the chemical reaction.

At least some of the particles may include a third metal. The third metal may be different from the first metal. The third metal may be different from the second metal. The third metal may have a diffusivity greater than about 1E-30 $cm^2/s$ at 25° C.

The third metal may include Al and/or Ag.

The ink may also include an exothermic reactive mixture. The exothermic reactive mixture may be other than the first metal and other than the substance. The exothermic reactive mixture may be dispersed in the carrier fluid.

The exothermic reactive mixture may include Al and Pd. The exothermic reactive mixture may include Al and Ni.

The ink may also include Al. The method may also include reflowing the Al to form reflowed Al, and flowing the reflowed Al into voids defined by the product.

Applying the ink to the substrate may include inkjet spraying the ink onto the substrate, or extruding the ink through a nozzle onto the substrate, or painting the ink onto the substrate by physically contacting the substrate with an applicator, such as a brush.

An embodiment of the present invention provides a method for fabricating an electric conductor. The method includes applying a first ink to a substrate and applying a second ink to the substrate. The first ink is distinct from the second ink. The first ink includes a plurality of first particles dispersed in a first carrier fluid. Each first particle of the plurality of first particles includes a first metal having a first diffusivity. The second ink includes a plurality of second particles dispersed in a second carrier fluid. Each second particle of the plurality of second particles includes a substance with which the first metal is chemically reactive to produce a product during a chemical reaction. The product is electrically conductive. The product has a second diffusivity that is less than the first diffusivity. The method also includes reacting the first metal with the substance, according to the chemical reaction, to produce the product on the substrate.

Reacting the first metal may include applying energy to at least a portion of the first or second ink on the substrate, without heating the entire substrate.

Applying the energy may include heating the at least the portion of the first or second ink on the substrate.

Applying the energy may include illuminating the at least the portion of the first or second ink on the substrate with a light source, such as a laser or a lamp.

Applying the energy may include passing an electric current through the at least the portion of the first or second ink on the substrate.

The method may also include providing a substrate that includes a material, different from the first metal, with which the first metal is chemically reactive to produce the product during the chemical reaction.

The first diffusivity may be greater than about 1E-30 $cm^2/s$ at 25° C.

The first diffusivity may include a first propensity to electromigrate.

The second diffusivity may be less than about 1E-25 $cm^2/s$ at 25° C.

The second diffusivity may be at least about 100 times less than the first diffusivity.

Resistivity of the product may be less than about 500 $\mu\Omega$-cm.

The product may remain entirely solid up to at least about 300° C.

The first metal may have has a thermal stability. The product may have a thermal stability greater than the thermal stability of the first metal. The first metal may have an electrical stability. The product may have an electrical stability greater than the electrical stability of the first metal.

The chemical reaction may be exothermic.

The first metal may include one or more of: Cu, Al, Ag, Au, Pd, Pt, Si, Ti, Zr, Rh, Ir, Os, Ta, Mg, Ru, Fe, Ni, Co and/or C; and/or an oxide of Cu, Al, Ag, Au, Pd, Pt, Si, Ti, Zr, Rh, Ir, Os, Ta, Mg, Ru, Fe, Ni, Co and/or C; and/or a nitride of Cu, Al, Ag, Au, Pd, Pt, Si, Ti, Zr, Rh, Ir, Os, Ta, Mg, Ru, Fe, Ni, Co and/or C; and/or a phosphide of Cu, Al, Ag, Au, Pd, Pt, Si, Ti, Zr, Rh, Ir, Os, Ta, Mg, Ru, Fe, Ni, Co and/or C.

The product may include an intermetallic of Cu, Al, Ag, Au, Pd, Pt, Si, Ti, Zr, Rh, Ir, Os, Ta, Mg, Ru, Fe, Ni, Co and/or C; and/or a solid solution of Cu, Al, Ag, Au, Pd, Pt, Si, Ti, Zr, Rh, Ir, Os, Ta, Mg, Ru, Fe, Ni, Co and/or C.

The substance may include a second metal, different from the first metal.

The substance may include a non-metal.

The first metal may include Al. The second metal may include Cu. The product may include $CuAl_2$.

Each particle may have a respective shape. The shape may be or include: flake, plate, cube, sphere, irregular, cylinder and/or trough.

At least some of the particles may include a coating. The coating may include a material having a diffusivity greater than about 1E-30 $cm^2/s$ at 25° C.

The coating may include Al or Ag.

At least some of the first or second particles may include a third metal. The third metal may be different from the first metal. The third metal may be different from the second metal. The third metal may be chemically reactive with the first metal to produce at least a portion of the product during the chemical reaction.

At least some of the first particles may include a third metal. The third metal may be different from the first metal. The third metal may be different from the second metal. The third metal may have a diffusivity greater than about 1E-30 $cm^2/s$ at 25° C.

The third metal may include Al and/or Ag.

The ink may also include an exothermic reactive mixture. The exothermic reactive mixture may be other than the first metal and other than the substance. The exothermic reactive mixture may be dispersed in the first or second carrier fluid.

The exothermic reactive mixture may include Al and Pd. The exothermic reactive mixture may include Al and Ni.

The first or second ink may also include Al. The method may also include reflowing the Al to form reflowed Al, and flowing the reflowed Al into voids defined by the product.

Applying the first ink to the substrate may include inkjet spraying the first ink onto the substrate, or extruding the first ink through a nozzle onto the substrate, or painting the first ink onto the substrate by physically contacting the substrate with an applicator, such as a brush. Applying the second ink to the substrate may include inkjet spraying the second ink onto the substrate, or extruding the second ink through a nozzle onto the substrate, or painting the second ink onto the substrate by physically contacting the substrate with an applicator, such as a brush.

An embodiment of the present invention provides a method for fabricating an electric conductor that includes providing a substrate and applying a first ink to the substrate. The first ink includes a plurality of first particles dispersed in a first carrier fluid. Each first particle of the plurality of first particles includes a first metal having a first diffusivity. The substrate includes a substance with which the first metal is chemically reactive to produce a product during a chemical reaction. The product is electrically conductive. The product has a second diffusivity that is less than the first diffusivity. The method includes reacting the first metal with the substance, according to the chemical reaction, to produce the product on the substrate.

Reacting the first metal may include applying energy to at least a portion of the ink on the substrate, without heating the entire substrate.

Applying the energy may include heating the at least the portion of the ink on the substrate.

Applying the energy may include illuminating the at least the portion of the ink on the substrate with a light source, such as a laser or a lamp.

Applying the energy may include passing an electric current through the at least the portion of the ink on the substrate.

The method may also include providing a substrate that includes a material, different from the first metal, with which the first metal is chemically reactive to produce the product during the chemical reaction.

The first diffusivity may be greater than about 1E-30 $cm^2/s$ at 25° C.

The first diffusivity may include a first propensity to electromigrate.

The second diffusivity may be less than about 1E-25 $cm^2/s$ at 25° C.

The second diffusivity may be at least about 100 times less than the first diffusivity.

Resistivity of the product may be less than about 500 $\mu\Omega$-cm.

The product may remain entirely solid up to at least about 300° C.

The first metal may have has a thermal stability. The product may have a thermal stability greater than the thermal stability of the first metal. The first metal may have an electrical stability. The product may have an electrical stability greater than the electrical stability of the first metal.

The chemical reaction may be exothermic.

The first metal may include one or more of: Cu, Al, Ag, Au, Pd, Pt, Si, Ti, Zr, Rh, Ir, Os, Ta, Mg, Ru, Fe, Ni, Co and/or C; and/or an oxide of Cu, Al, Ag, Au, Pd, Pt, Si, Ti, Zr, Rh, Ir, Os, Ta, Mg, Ru, Fe, Ni, Co and/or C; and/or a nitride of Cu, Al, Ag, Au, Pd, Pt, Si, Ti, Zr, Rh, Ir, Os, Ta, Mg, Ru, Fe, Ni, Co and/or C; and/or a phosphide of Cu, Al, Ag, Au, Pd, Pt, Si, Ti, Zr, Rh, Ir, Os, Ta, Mg, Ru, Fe, Ni, Co and/or C.

The product may include an intermetallic of Cu, Al, Ag, Au, Pd, Pt, Si, Ti, Zr, Rh, Ir, Os, Ta, Mg, Ru, Fe, Ni, Co and/or C; and/or a solid solution of Cu, Al, Ag, Au, Pd, Pt, Si, Ti, Zr, Rh, Ir, Os, Ta, Mg, Ru, Fe, Ni, Co and/or C.

The substance may include a second metal, different from the first metal.

The substance may include a non-metal.

The first metal may include Al. The second metal may include Cu. The product may include $CuAl_2$.

Each particle may have a respective shape. The shape may be or include: flake, plate, cube, sphere, irregular, cylinder and/or trough.

At least some of the particles may include a coating. The coating may include a material having a diffusivity greater than about 1E-30 cm$^2$/s at 25° C.

The coating may include Al or Ag.

At least some of the particles may include a third metal. The third metal may be different from the first metal. The third metal may be different from the second metal. The third metal may be chemically reactive with the first metal to produce at least a portion of the product during the chemical reaction.

At least some of the particles may include a third metal. The third metal may be different from the first metal. The third metal may be different from the second metal. The third metal may have a diffusivity greater than about 1E-30 cm$^2$/s at 25° C.

The third metal may include Al and/or Ag.

The ink may also include an exothermic reactive mixture. The exothermic reactive mixture may be other than the first metal and other than the substance. The exothermic reactive mixture may be dispersed in the carrier fluid.

The exothermic reactive mixture may include Al and Pd. The exothermic reactive mixture may include Al and Ni.

The ink may also include Al. The method may also include reflowing the Al to form reflowed Al, and flowing the reflowed Al into voids defined by the product.

Applying the ink to the substrate may include inkjet spraying the ink onto the substrate, or extruding the ink through a nozzle onto the substrate, or painting the ink onto the substrate by physically contacting the substrate with an applicator, such as a brush.

An embodiment of the present invention provides a printer for printing an electrically conductive circuit on a substrate. The printer includes a reservoir containing ink. The ink includes a plurality of particles dispersed in a carrier fluid. At least some of the particles include a first metal having a first diffusivity. At least some of the particles include a substance with which the first metal is chemically reactive to produce a product during a chemical reaction. The product is electrically conductive. The product has a second diffusivity that is less than the first diffusivity. The printer also includes an ink jet or nozzle in fluid communication with the reservoir. The ink jet or nozzle is configured to spray droplets or extrude a line of the ink onto the substrate in a pattern according to an electronic signal, thereby producing deposited ink on the substrate. The printer also includes an energy source. The energy source is configured to heat the deposited ink sufficiently to initiate the chemical reaction to react the first metal with the substance in the deposited ink, according to the chemical reaction, to produce the product on the substrate.

In some embodiments, the at least some of the particles that include the first metal also include the substance. In other embodiments, the at least some of the particles that include the first metal are distinct from the at least some of the particles that include the substance. In yet other embodiments, some of the particles that include the first metal also include the substance, and other of the particles that include the first metal do not include any of the substance.

The first diffusivity may be greater than about 1E-30 cm$^2$/s at 25° C.

The first diffusivity may include a first propensity to electromigrate.

The second diffusivity may be less than about 1E-25 cm$^2$/s at 25° C.

The second diffusivity may be at least about 100 times less than the first diffusivity.

Resistivity of the product may be less than about 500 μΩ-cm.

The product may remain entirely solid up to at least about 300° C.

The first metal may have has a thermal stability. The product may have a thermal stability greater than the thermal stability of the first metal. The first metal may have an electrical stability. The product may have an electrical stability greater than the electrical stability of the first metal.

The chemical reaction may be exothermic.

The first metal may include one or more of: Cu, Al, Ag, Au, Pd, Pt, Si, Ti, Zr, Rh, Ir, Os, Ta, Mg, Ru, Fe, Ni, Co and/or C; and/or an oxide of Cu, Al, Ag, Au, Pd, Pt, Si, Ti, Zr, Rh, Ir, Os, Ta, Mg, Ru, Fe, Ni, Co and/or C; and/or a nitride of Cu, Al, Ag, Au, Pd, Pt, Si, Ti, Zr, Rh, Ir, Os, Ta, Mg, Ru, Fe, Ni, Co and/or C; and/or a phosphide of Cu, Al, Ag, Au, Pd, Pt, Si, Ti, Zr, Rh, Ir, Os, Ta, Mg, Ru, Fe, Ni, Co and/or C.

The product may include an intermetallic of Cu, Al, Ag, Au, Pd, Pt, Si, Ti, Zr, Rh, Ir, Os, Ta, Mg, Ru, Fe, Ni, Co and/or C; and/or a solid solution of Cu, Al, Ag, Au, Pd, Pt, Si, Ti, Zr, Rh, Ir, Os, Ta, Mg, Ru, Fe, Ni, Co and/or C.

The substance may include a second metal, different from the first metal.

The substance may include a non-metal.

Each particle may include at least three alternating layers of the first metal and the second metal.

Each particle may include a matrix of the first metal and the second metal.

The first metal may include Al. The second metal may include Cu. The product may include CuAl$_2$.

Each particle may have a respective shape. The shape may be or include: flake, plate, cube, sphere, irregular, cylinder and/or trough.

At least some of the particles may include a coating. The coating may include a material having a diffusivity greater than about 1E-30 cm$^2$/s at 25° C.

The coating may include Al or Ag.

At least some of the particles may include a third metal. The third metal may be different from the first metal. The third metal may be different from the second metal. The third metal may be chemically reactive with the first metal to produce at least a portion of the product during the chemical reaction.

At least some of the particles may include a third metal. The third metal may be different from the first metal. The third metal may be different from the second metal. The third metal may have a diffusivity greater than about 1E-30 cm$^2$/s at 25° C.

The third metal may include Al and/or Ag.

The ink may also include an exothermic reactive mixture. The exothermic reactive mixture may be other than the first metal and other than the substance. The exothermic reactive mixture may be dispersed in the carrier fluid.

The exothermic reactive mixture may include Al and Pd. The exothermic reactive mixture may include Al and Ni.

An embodiment of the present invention provides a printer for printing an electrically conductive circuit on a substrate. The printer includes a first reservoir containing a first ink. The printer includes a second reservoir containing a second ink. The first ink includes a plurality of first particles dispersed in a first carrier fluid. Each first particle of the plurality of first particles includes a first metal having a first diffusivity. The second ink is separate from the first ink. The second ink includes a plurality of second particles dispersed in a second carrier fluid. Each second particle of the plurality of second particles includes a substance with which the first metal is chemically reactive to produce a product during a chemical reaction. The product is electrically conductive. The product has a second diffusivity that is less than the first diffusivity. The printer also includes an ink jet or nozzle in fluid communication with the each reservoir. The ink jet or nozzle is configured to spray droplets or extrude a line of the first and second ink onto the substrate in a pattern according to an electronic signal, thereby producing deposited ink on the substrate. The printer also includes an energy source. The energy source is configured to heat the deposited ink sufficiently to initiate the chemical reaction to react the first metal with the substance in the deposited ink, according to the chemical reaction, to produce the product on the substrate.

The first diffusivity may be greater than about 1E-30 $cm^2/s$ at 25° C.

The first diffusivity may include a first propensity to electromigrate.

The second diffusivity may be less than about 1E-25 $cm^2/s$ at 25° C.

The second diffusivity may be at least about 100 times less than the first diffusivity.

Resistivity of the product may be less than about 500 μΩ-cm.

The product may remain entirely solid up to at least about 300° C.

The first metal may have has a thermal stability. The product may have a thermal stability greater than the thermal stability of the first metal. The first metal may have an electrical stability. The product may have an electrical stability greater than the electrical stability of the first metal.

The chemical reaction may be exothermic.

The first metal may include one or more of: Cu, Al, Ag, Au, Pd, Pt, Si, Ti, Zr, Rh, Ir, Os, Ta, Mg, Ru, Fe, Ni, Co and/or C; and/or an oxide of Cu, Al, Ag, Au, Pd, Pt, Si, Ti, Zr, Rh, Ir, Os, Ta, Mg, Ru, Fe, Ni, Co and/or C; and/or a nitride of Cu, Al, Ag, Au, Pd, Pt, Si, Ti, Zr, Rh, Ir, Os, Ta, Mg, Ru, Fe, Ni, Co and/or C; and/or a phosphide of Cu, Al, Ag, Au, Pd, Pt, Si, Ti, Zr, Rh, Ir, Os, Ta, Mg, Ru, Fe, Ni, Co and/or C.

The product may include an intermetallic of Cu, Al, Ag, Au, Pd, Pt, Si, Ti, Zr, Rh, Ir, Os, Ta, Mg, Ru, Fe, Ni, Co and/or C; and/or a solid solution of Cu, Al, Ag, Au, Pd, Pt, Si, Ti, Zr, Rh, Ir, Os, Ta, Mg, Ru, Fe, Ni, Co and/or C.

The substance may include a second metal, different from the first metal.

The substance may include a non-metal.

The first metal may include Al. The second metal may include Cu. The product may include $CuAl_2$.

Each particle may have a respective shape. The shape may be or include: flake, plate, cube, sphere, irregular, cylinder and/or trough.

At least some of the particles may include a coating. The coating may include a material having a diffusivity greater than about 1E-30 $cm^2/s$ at 25° C.

The coating may include Al or Ag.

At least some of the first or second particles may include a third metal. The third metal may be different from the first metal. The third metal may be different from the second metal. The third metal may be chemically reactive with the first metal to produce at least a portion of the product during the chemical reaction.

At least some of the first particles may include a third metal. The third metal may be different from the first metal.

The third metal may be different from the second metal. The third metal may have a diffusivity greater than about 1E-30 $cm^2/s$ at 25° C.

The third metal may include Al and/or Ag.

The ink may also include an exothermic reactive mixture. The exothermic reactive mixture may be other than the first metal and other than the substance. The exothermic reactive mixture may be dispersed in the first or second carrier fluid.

The exothermic reactive mixture may include Al and Pd. The exothermic reactive mixture may include Al and Ni.

BRIEF DESCRIPTION OF THE SEVERAL VIEWS OF THE DRAWING

The invention will be more fully understood by referring to the following Detailed Description of Specific Embodiments in conjunction with the Drawings, of which.

DETAILED DESCRIPTION OF SPECIFIC EMBODIMENTS

Figure 1:
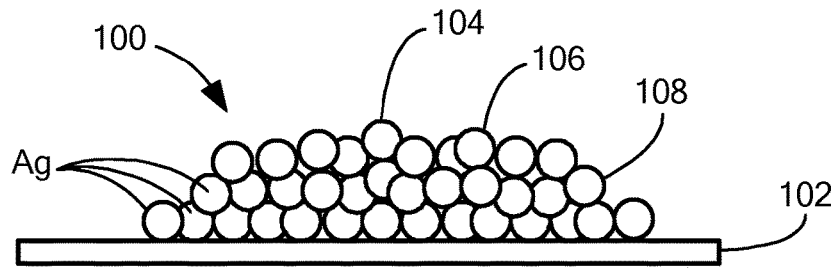
FIG. 1 is a schematic diagram illustrating inkjet printed ink on a substrate, before sintering, according to the prior art.

In accordance with embodiments of the present invention, methods and apparatus are disclosed for inks that, once applied to a substrate and sintered, form electrically conductive lines or areas that are capable of handling high current densities, without failure due to electromigration, for much longer than conventional inks.

Definitions

As used herein, the following terms shall have the following meanings, unless otherwise indicated by context.

Element—a chemical element; one of more than one hundred substances that cannot be chemically interconverted or broken down into simpler substances and are primary constituents of matter; each element is distinguished by its atomic number, i.e., the number of protons in the nuclei of its atoms; elements are listed in the periodic table.

Metal—a metal element, a metalloid element, a metallic compound or a compound with at least one metalloid element. As used herein, C, O and P are considered metals. Metalloid elements are: B, Si, Ge, As, Sb, Te and Po. Non-metal elements include Uus and Uuo. Metal elements appear in the periodic table to the left of the metalloid elements and the non-metal elements, except H is not a metal.

Product—a compound or alloy produced directly by a chemical reaction among two or more materials, or indirectly, such as a result of a catalytic reaction with one or more of the materials.

Dielectric material—a material having an electrical resistivity greater than about 1 Ω-m.

Electrically conductive—having an electrical resistivity less than about 1 Ω-m.

Electrical conductor—a conductor having an electrical resistivity less than about 1 Ω-m.

Degrade—a performance of a material changes over a timescale that ranges from hours to years. The performance may be electrical, e.g., resistance, or structural, e.g., mechanically continuous. Degradation modes may include diffusion of metal atoms in response to an electric field, known as "electromigration," or diffusion of metal atoms into neighboring dielectric in response to an electric field or temperature, known as "time dependent dielectric breakdown." Another example of degradation of printed silver conductor is its instability of electrical resistance in time when exposed to an electric field. A silver line shows variations in resistance over time in such a way that it may decrease in resistance when current is passed through the line. While in other contexts this may not be considered degradation, we consider it degradation in the context of this patent application, because it is a change in performance while using the silver as a conductor.

Thermal stability—a comparative term, wherein a material system that is more thermally stable exhibits less of a change in diffusivity, atomic movement or phase, in response to an increase in temperature, than a material system that is less thermally stable.

Electrical stability—a comparative term, wherein a material system that is more electrically stable exhibits less of a change in electrical resistivity, in response to an extended period of time when carrying an electrical current, than a material system that is less electrically stable. Since electrical current can also cause an increase in temperature (Joule heating), changes in diffusivity, atomic movement or phase are electrically induced to the extent they are greater than the changes in diffusivity, atomic movement or phase that are expected from the increased temperature.

Flow/reflow material—a material that is at least partially unreacted and is softened by the conditions of the reaction, for example, heat generated by an exothermic reaction, to exhibit an increase in atomic motion so that it changes shape and fits within voids of reacting material or materials. The effect of the reflow is to densify, and possibly improve electrical conductivity between, the reacted material(s). Note that flow/reflow does not necessarily require melting. For example, aluminum in the solid state can be heated and made to reflow without melting.

Conductor Degradation due to Electromigration

Figure 2:
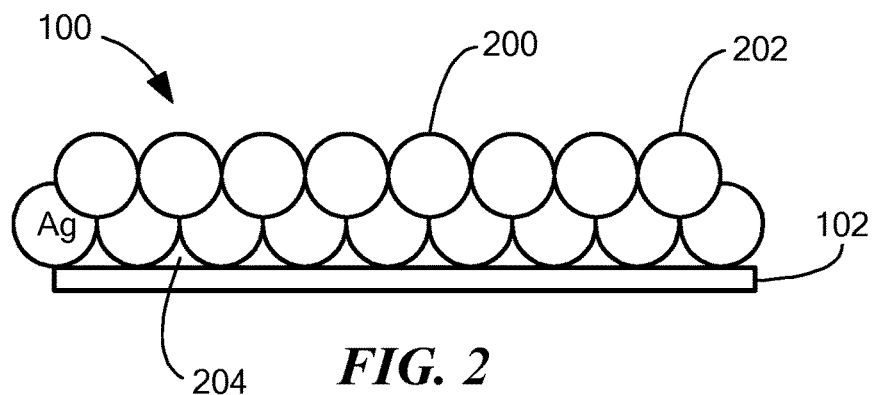
FIG. 2 schematically illustrates the ink of FIG. 1 after the ink has been sintered, according to the prior art.
Figure 3:
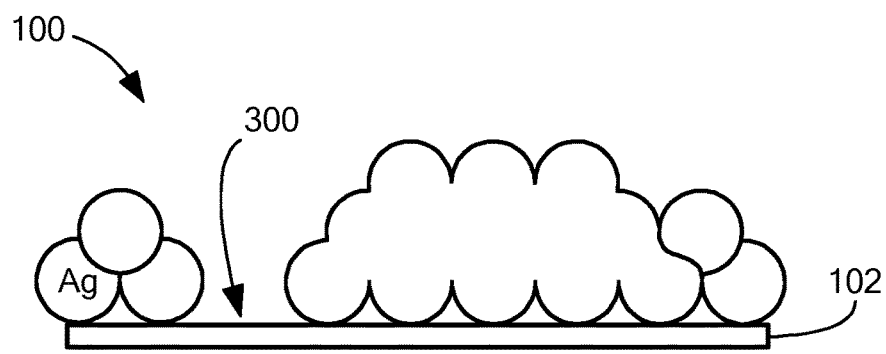
FIG. 3 schematically illustrates the sintered ink of FIG. 2 after a conductive degradation, due to electromigration.

As noted, conventional conductive inks degrade after relatively short times. FIG. 1 schematically illustrates prior art conductive ink 100 that has been inkjet printed on a substrate 102, before the ink has been sintered. The ink 100 includes electrically conductive silver particles, represented by particles 104, 106 and 108. FIG. 2 schematically illustrates the ink 100 after it has been sintered by a high-temperature (such as about 300° C.) process, according to the prior art. As can be seen, several of the silver particles 104-108 have been fused by the sintering to form larger particles, exemplified by particles 200 and 202, and at least some of the larger particles 200-202 are mechanically and electrically joined together. Despite the sintering, voids remain defined by the particles 200-202, as exemplified by void 204. In addition, there are many particles 200-202. Therefore, there are many boundaries between, and surfaces on, the particles 200-202. FIG. 3 schematically illustrates the sintered ink of FIG. 2 after conductive degradation, including a gap 300, due to electromigration. As used herein, the term degradation includes, but is not limited to, failure.

Electromigration is the transport of material caused by gradual movement of ions in an electrical conductor due to momentum transfer between conducting electrons and diffusing metal atoms. High electric current density in an electric conductor or within an electric interconnect, such as a wire bond within an integrated circuit (IC), can cause electromigration of metal ions, leading to degradation of the conductor or interconnect (hereinafter collectively referred to as a "conductor"). Electromigration is caused primarily by momentum transfer between conduction electrons and metal ions in the crystal lattice of the conductor, primarily at grain boundaries and material interfaces. A force, known as $F_{wind}$, caused by the flow of charge carriers is exerted on the metal ions in the direction of the current flow. Because the metal ions are relatively weakly bonded at grain boundaries and material interfaces, once the $F_{wind}$ force exceeds a threshold, the force separates atoms from the grain boundaries, and the atoms are transported, generally in the direction of the current and along grain boundaries. Consequently, electric currents can move material in the conductor, causing voids and hillocks to develop in the conductor, ultimately leading to conductor degradation. Additional information about electromigration is available in Jens Lieng, "Electromigration and Its Impact on Physical design in Future Technologies," Dresden University of Technology, ACM International Symposium on Physical Design (ISPD), pp. 33-40, 2013, the entire contents of which are hereby incorporated by reference herein, for all purposes.

Figure 4:
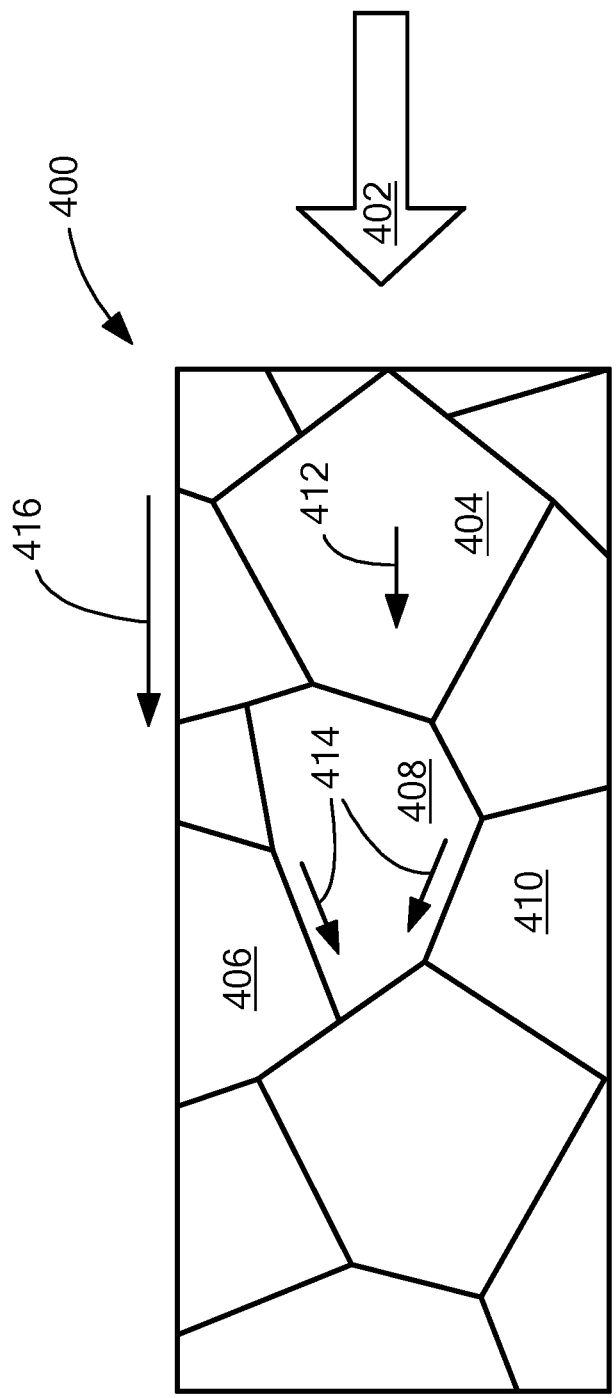
FIG. 4 is a schematic diagram illustrating diffusion processes within the lattice of a conductor, according to known principles.

The transport of these atoms is one example of diffusion. Diffusion here means a gradual movement of atoms within or out of a material, whether caused by electromigration or another process. Diffusion occurs at grain boundaries (boundary diffusion), within the bulk of a grain (bulk diffusion) and/or at the surface of a material (surface diffusion), as schematically illustrated in FIG. 4. FIG. 4 illustrates electromigration-caused diffusion processes within the lattice of a conductor 400, as a result of an electric current 402 flowing through the conductor 400. Several grains of the conductor, exemplified by grains 404, 406, 408 and 410, are shown. Bulk diffusion within the grain 404 is indicated by an arrow 412. Boundary diffusion along boundaries of adjacent grains 406 and 408 and adjacent grains 408 and 410 is indicated by arrows 414. Surface diffusion is indicated by arrow 416.

The propensity of atoms in a conductor to electromigrate depends on the material of the conductor, current density and temperature. J. R. Black developed an empirical model to estimate mean time to failure (MTTF) of a wire segment, taking into consideration electromigration. Black's equation is as follows:

$$MTTF = (A/(H^n))e^{\frac{E_a}{kT}} \quad (1)$$

where A is a constant based on the cross-sectional area of the conductor, J is current density, $E_a$ is activation energy (for example, 0.7 eV for grain boundary diffusion in Al), k is Boltzmann's constant, T is temperature in Kelvin and n is a scaling factor. It has been established through studies on Al and Cu interconnects that void-growth-limited failure is characterized by n=1, while void-nucleation-limited failure is best represented by n=2.

Diffusivity means a rate at which particles, such as metal atoms or ions, of a material can spread, such as within another material or within itself ("self-diffusion"), as a result of some gradient or force. As used herein, diffusivity includes conventional diffusivity (diffusion coefficient), i.e., a proportionality constant between molar flux due to molecular diffusion and a gradient in a concentration of the species, or a driving force for diffusion. Diffusivity is generally prescribed for a given pair of species, and pairwise for a multi-species system, but it can also be specified for a single species. The higher the diffusivity, the faster particles spread. Diffusivity is conventionally characterized in units of area per time. Diffusivity has an SI unit of $m^2/s$. Alternatively, as used herein, a propensity for electromigration may be used as an analog or substitute for diffusivity. Similarly, the term diffusivity may be considered to mean a function of conventional diffusivity and electromigration, i.e., a mathematical combination of conventional diffusivity and electromigration.

The propensity for electromigration of a material may be measured in any suitable way, such as by the MTTF of the material, in the context of a given current density and a given temperature, or by any other suitable formula or method. The propensities for electromigration, and therefore the diffusivities, of two materials may be compared by comparing the materials' respective MTTFs in the context of a given current density and a given temperature, or simply assuming equal current densities and equal temperatures. Alternatively, the diffusivities of two materials may be compared by comparing values derived by any other suitable formula or method.

Insights

At least some amount of diffusion is required for sintering, so individual conductive particles can join to form electrically conductive lines, for example as discussed with respect to FIGS. 1-3. The inventors have, however, identified a previously unrecognized problem with conventional sintering, i.e., conventional sintering does not alter the diffusivity of conductive particles deposited in conventional inkjet-printed electronic circuits. Consequently, the circuits are prone to degradation, and the degradation is caused by the same process that facilitated forming the circuit in the first place. Although high diffusivity is desirable during sintering to convert ink particles into a continuous conductor, low diffusivity is desirable thereafter to prevent or at least forestall degradation of the resulting conductor.

The inventors realized a solution to this problem involves decoupling the sintering mechanism from the degradation mechanism. Furthermore, the inventors realized a chemical reaction could be used to fuse the ink particles, and the same chemical reaction could reduce the diffusivity of the material (s) involved. Ideally, the chemical reaction is exothermic, thereby facilitating the fusing of the ink particles, concentrating heat in the exact location where it is needed, i.e., in the ink particles and at particle junctions, and reducing the temperature to which the entire substrate needs to be subjected.

Figure 5:
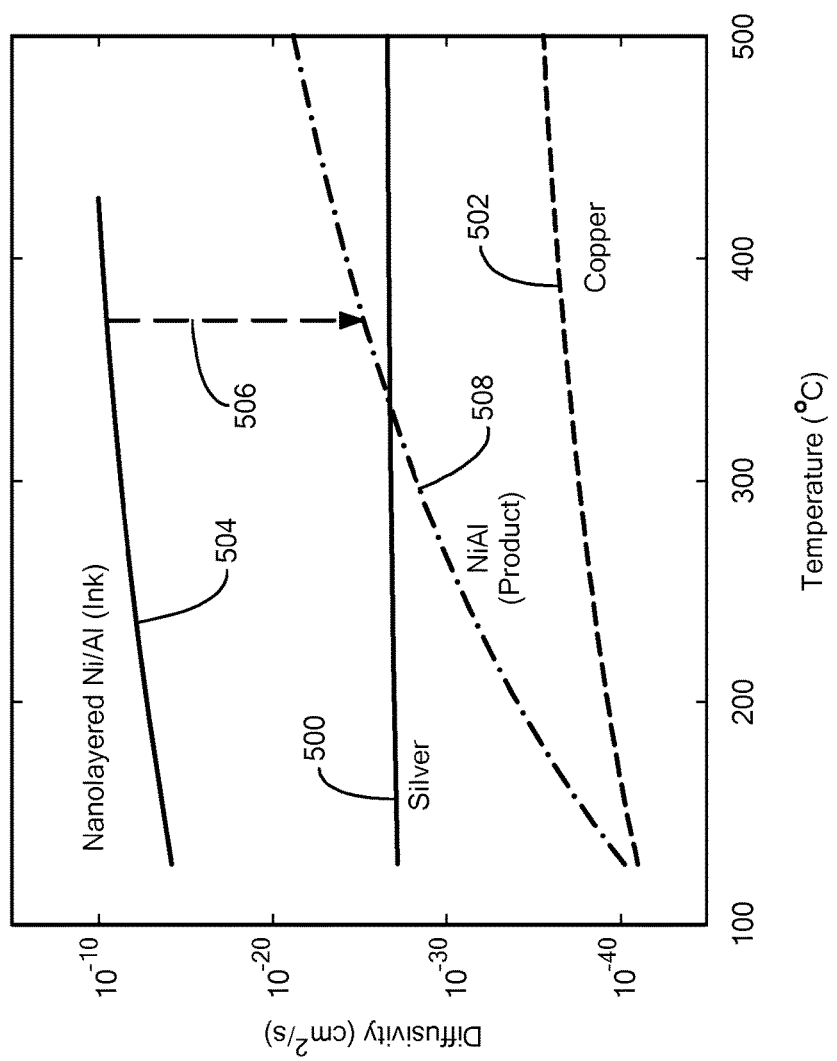
FIG. 5 is a graph of diffusivity of several materials, as a function of temperature, including of a component of an ink according to an embodiment of the present invention.
Figure 6:
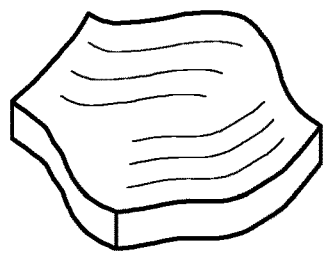
FIGS. 6-12 are perspective views of representative shapes of particles in the ink discussed with respect to FIG. 5, including flake, plate, cube, sphere, cylinder, trough and irregular, according to respective embodiments of the present invention.
Figure 7:
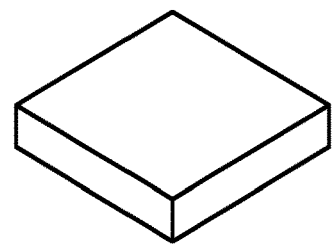
Figure 8:
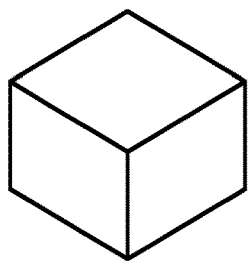
Figure 9:
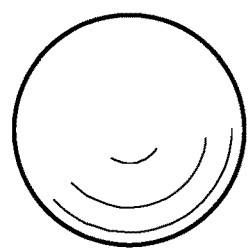
Figure 10:
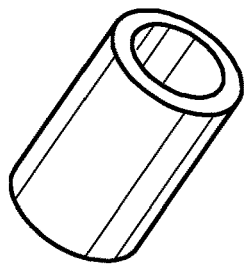
Figure 11:
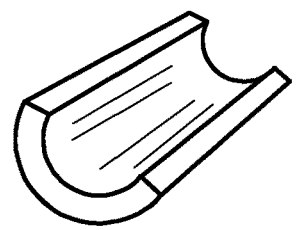

These principles are graphically illustrated in FIG. 5. FIG. 5 is a graph of diffusivity of several materials, as a function of temperature. As can be seen, the diffusivity or propensity for electromigration of silver (line 500) is significantly greater than the diffusivity or propensity for electromigration of copper (line 502), which is one reason copper is preferred to silver in conventional PCB and IC manufacturing. Line 504 represents diffusivity of a material that includes alternating nanolayers of Ni and Al. After a chemical reaction, the nanolayered Ni/Al is converted (as represented by dashed arrow 506) to an intermetallic alloy of nickel and aluminum (NiAl). An intermetallic material, also called an intermetallic compound, intermetallic alloy, ordered intermetallic alloy or long-range-ordered alloy, is a solid-state compound exhibiting metallic bonding, defined stoichiometry and ordered crystal structure. Many intermetallic compounds are often simply called alloys.

Line 508 represents the diffusivity of NiAl. As can be seen, the diffusivity of NiAl 508 is significantly less than the diffusivity of nanolayered Ni/Al 504 and, at practical circuit temperatures, the diffusivity of NiAl 508 is significantly less than the diffusivity of sintered or unsintered silver 500. At practical circuit temperatures, the diffusivity of NiAl 508 is only slightly higher than the diffusivity of copper 502. The electrical resistivity of NiAl is 32.59E-8 Ω-m, higher than the resistivity of silver, but nevertheless useful in electronic circuits, particularly for short, low current-carrying interconnections within integrated circuits (ICs).

As used herein, including in the claims, a "product" of a chemical reaction is a material that results from the reaction. For example, NiAl is a product of the above-described chemical reaction between Ni and Al. Properties of ideal products for printing of conductive circuits include low resistivity, such as less than 10 μΩ-cm, and high reliability, such as $t_{50}$ greater than 1 year at a current density of 1E4 $A/cm^2$ and at a temperature of 85° C. Characteristics of ideal chemical reactions for producing these products include operation such that substrates are not exposed to temperatures exceeding 200° C., such as to protect soldered components and plastic packages.

Ink

As used herein, "ink" means a substance that can be deposited on a substrate, such as by spraying the ink, as in inkjet or aerosol jet printing, by applying the ink with a brush or other applicator, by extruding the ink from a nozzle or by applying the ink via screen printing methods. According to one embodiment of the present invention, an ink includes a first metal and another substance, such as a second metal, dispersed in a carrier fluid. The carrier fluid may, but need not, be a solvent, such as water or an organic solvent, although the first metal and the other substance need not be dissolved in the solvent. A solvent may be selected for the carrier fluid to facilitate evaporation of the carrier fluid, after the ink has been deposited on the substrate.

The first metal and the other substance are selected such that the first metal and the other substance will participate in a chemical reaction. The first metal and the other substance are referred to as participants in the chemical reaction. The participants are selected such that the chemical reaction produces a product, such as an alloy of the participants, that is electrically conductive and that has a diffusivity that is less, assuming equal current densities and temperatures, than the diffusivity of each participant before the reaction. Energy from an external source, such as a laser or oven, may be required to initiate the chemical reaction. The chemical reaction may be exothermic.

Figure 12:
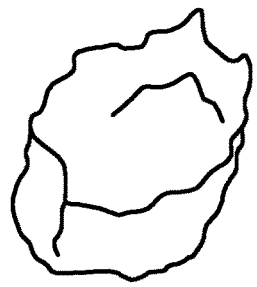

The first metal may be in the form of particles dispersed in the carrier fluid, and the other substance may be in the form of other particles dispersed in the carrier fluid. In other words, each participant may be contained in its own respective particles. Alternatively, each particle may include both participants, such as in alternating layers, in a matrix or in an unorganized mixture. In either case, the particles may have any suitable shape, such as at least a portion of a flake, plate, cube, sphere, cylinder or trough, as shown in FIGS. 6-11, respectively. Some or all the particles may be irregularly shaped, as shown in FIG. 12. All the particles need not have identical shapes or sizes.

The carrier fluid may be glycol, ethanol, a dispersant based on 3,5,5-trimethylhexanol (TMH) or any other dispersant suitable for preventing the particles clumping together before they are printed. The carrier fluid may contain a surfactant to facilitate the particles coming into physical contact after printing.

Figure 13:
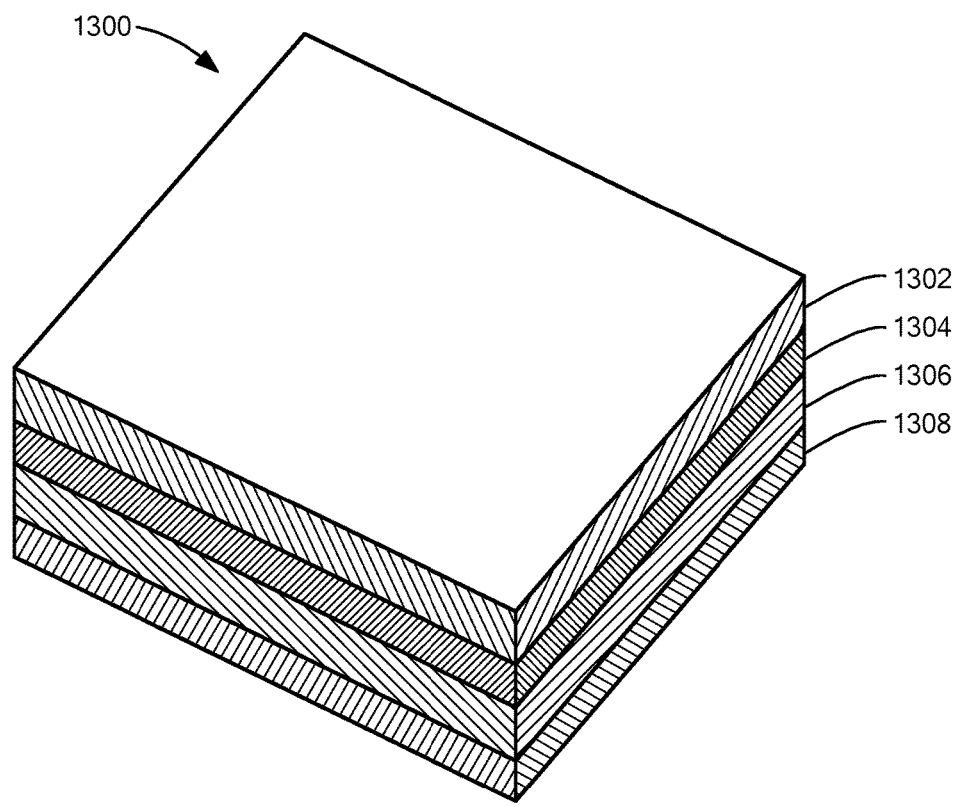
FIG. 13 is a schematic illustration of a multilayered particle, suitable for an ink, according to an embodiment of the present invention.

In some embodiments, each particle includes at least three alternating layers of the participants, as shown schematically in FIG. 13. In FIG. 13, a particle 1300 includes four alternating layers 1302, 1304, 1306 and 1308. Layers 1302 and 1306 are composed of one metal, such as Al, and the intervening layers 1304 and 1308, are composed of a different metal, such as Cu. In some embodiments, each particle includes hundreds of alternating nanolayers of the participants. The layers may be formed by physical vapor deposition (PVD), mechanical processing or any other suitable process. Suitable multilayer particles and methods for fabricating the particles are described in U.S. Pat. No. 9,382,167, titled "Layered Reactive Particles with Controlled Geometries, Energies, and Reactivities, and Methods for Making the Same," by Gregory M. Fritz, et al., the entire contents of which are hereby incorporated by reference herein, for all purposes.

Figure 14:
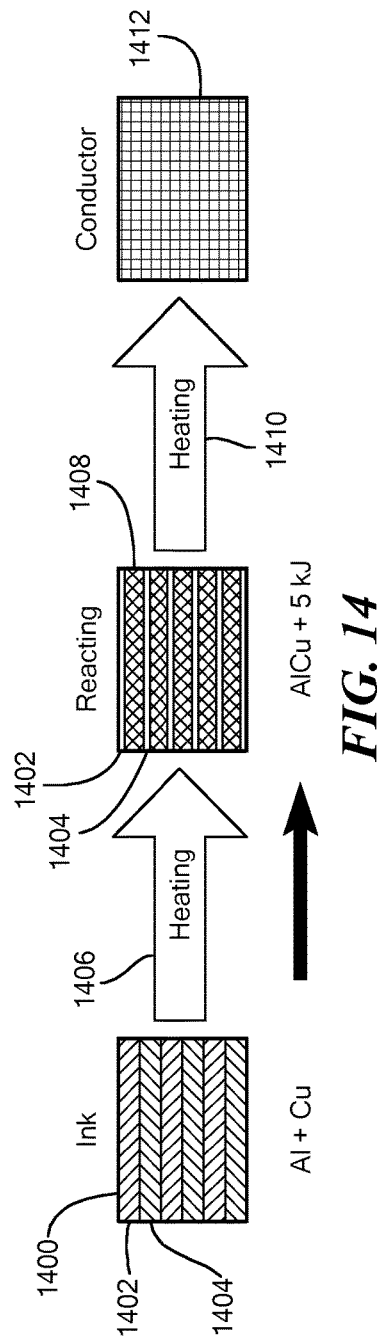
FIG. 14 schematically illustrates microstructural changes that occur as ink is sintered during a chemical reaction, according to embodiments of the present invention.

FIG. 14 schematically illustrates microstructural changes that occur as ink is sintered, according to some embodiments of the present invention. Ink containing multilayered particles, represented by particle 1400, is deposited on a substrate (not shown). Each particle 1400 includes alternating layers, represented by layers 1402 and 1404, of two different participants, such as Al and Cu. Energy is added to at least a portion of the ink, such as by heating the ink with a laser, infrared (IR) lamp or oven, as indicated at 1406, to initiate the reaction. The reaction may partially or fully produce the product. For example, in FIG. 14, at least a portion of layer 1402 and at least a portion of layer 1404 have reacted to produce an intermediate layer 1408 of AlCu. In this case, the reaction is exothermic, further heating the particle as indicated at 1410, thereby facilitating production of the product conductor AlCu 1412.

The nanolayers 1402-1404 in the particle 1400 comprise a steep chemical gradient that drives rapid (such as greater than about 10E-30 cm$^2$/s) mass diffusion, but below 200° C., as the low resistivity (in this example, less than 10 μΩ-cm) alloy 1412 is produced. The reaction releases heat, 5 kJ/mol in this case, which assists the sintering process. Alloys of Cu, Al, Ag, Au and C are good candidates as the product of the reaction. For example, $Al_xCu_{(1-x)}$ are good candidates, because they have relatively low propensity to electromigrate ($E_a$ in a range 0.7 to 1.2 eV), low resistivity, first liquidus is at a relatively high temperature (548° C.), enthalpy of Cu—Al bonds improves thermal stability over elemental Al and negative heat of mixing (−5 kJ/mol) assists sintering. Products of Al/Cu are likely to exhibit good adhesion to substrates, because Al and Cu individually exhibit good adhesion. Al and Cu react sufficiently to form mechanical bonds, but then the reaction stops, thereby avoiding poisoning electronic materials. Nanolayered materials, such as Ni/Al and Cu/Al, undergo interdiffusion much faster than Ag surface diffusion, because in these reactions there is an addition driving force to resolve the chemical gradient. Once intermixed, however, the products of the reactions are very stable, with diffusivities comparable to copper.

In some embodiments, the each participant is a different metal selected from Cu, Al, Ag, Au, Pd, Pt, Si, Ti, Zr, Rh, Ir, Os, Ta, Mg, Ru, Fe, Ni, Co and C or oxides or nitrides thereof. In some embodiments, the two metals are selected such that the reaction product includes an intermetallic, or a solid solution, of at least one of: Cu, Al, Ag, Au, Pd, Pt, Si, Ti, Zr, Rh, Ir, Os, Ta, Mg, Ru, Fe, Ni, Co and C.

Figure 15:
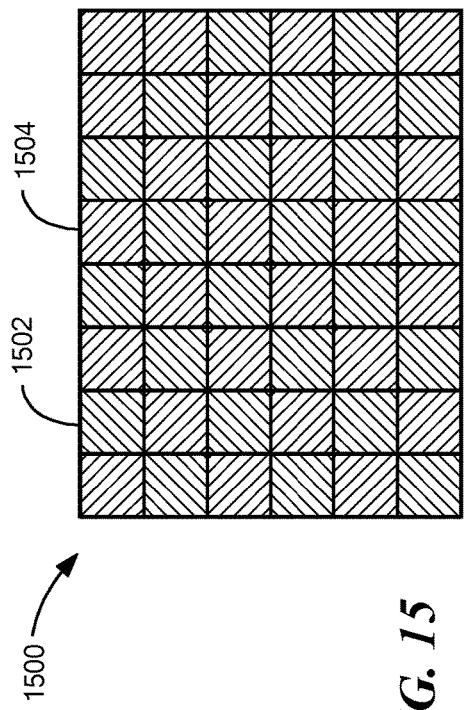
FIG. 15 is schematic illustration of an ink particle in which two metals are matrixed, according to an embodiment of the present invention.

In some embodiments, the ink includes more than two participants that react to form the product. As in the two-participant inks, the three or more participants may be alternatingly layered in each particle, or separate particles may bear one or more of the participants. In some embodiments, each particle includes a matrix of participants, as exemplified in FIG. 15, where a particle 1500 includes a matrix of two different metals, represented by matrix elements 1502 and 1504. Of course, more than two participants may be matrixed together in each particle (not shown). In some embodiments, the participants form an unorganized mixture (not shown) in each particle. Each particle may, but need not, include the same proportion of the participants.

As noted, the chemical reaction produces a product that has a diffusivity less than diffusivity of a metal participant of the chemical reaction. The diffusivity of one metal of the participants may be greater than about 1E-30 cm$^2$/s at 25° C. The diffusivity of the product may be less than about 1E-25 cm$^2$/s at 25° C. For example, metal in an ink may have a diffusivity of about 1E-10 cm$^2$/s at 25° C., and diffusivity of a product of the reaction may be about 1E-26 cm$^2$/s at 25° C.

Figure 16:
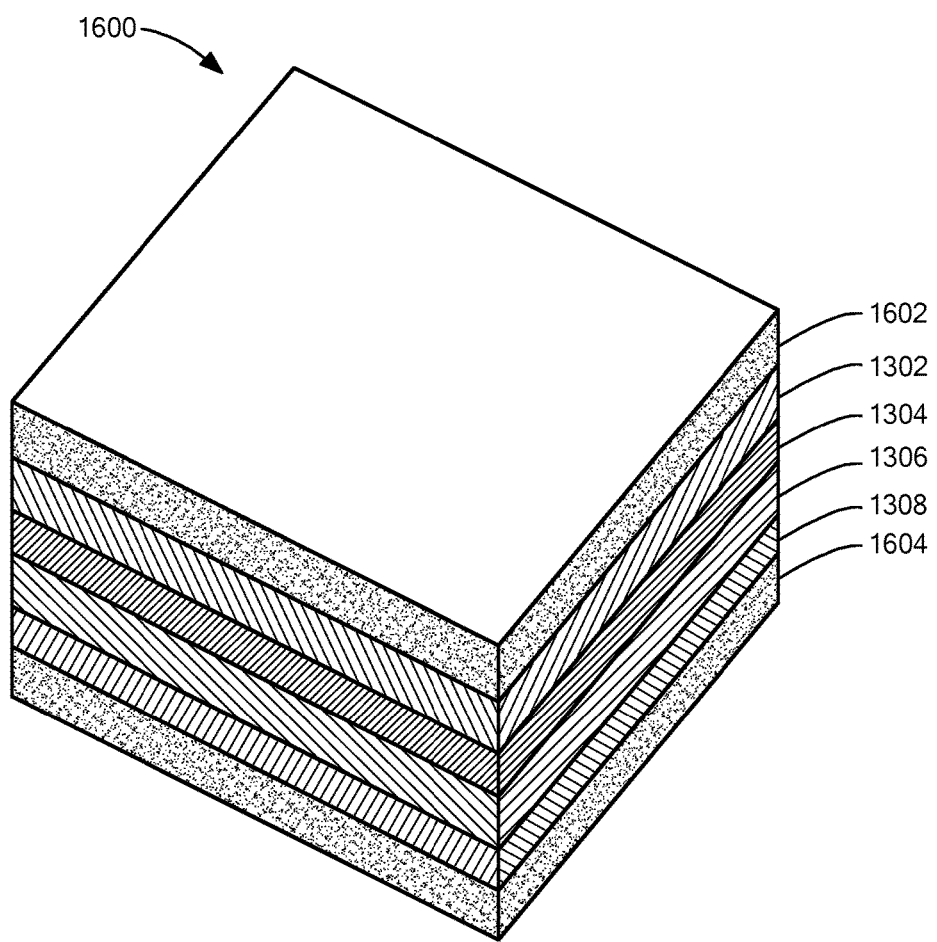
FIG. 16 is a schematic illustration of a particle, suitable for an ink, that includes additional layers of material to generate additional heat, according to an embodiment of the present invention.

Optionally, as shown schematically in FIG. 16, some or all the particles, represented by particle 1600, may be coated with a material, such as Ni/Al or Pd/Al, which reacts to generate additional heat and, thereby, promote binding the metals of the inner layers 1302-1308 together. Such coatings are shown at 1602 and 1604. Additional information about exothermic reactions between metals and metal oxides, exothermic reactions between metallic elements, and combustion of metals is available in S. H. Fischer, et al., A Survey of Combustible Metals, Thermites, and Intermetallics for Pyrotechnic Applications, Sandia National Laboratory, Albuquerque, N. Mex., AIAA Meeting Papers on Disc, July 1996, the entire contents of which are hereby incorporated by reference herein, for all purposes.

Figure 17:
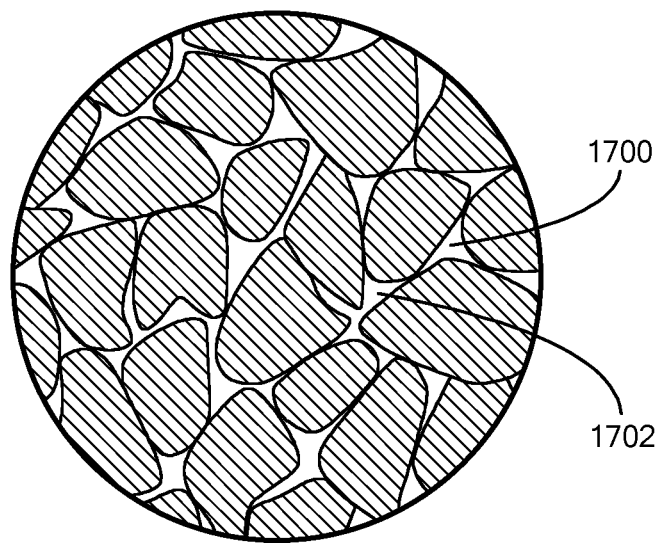
FIG. 17 schematically illustrates voids that may be defined between grains of a product of the chemical reaction, and FIG. 18 schematically illustrates these voids filled by a metal, according to an embodiment of the present invention.
Figure 18:
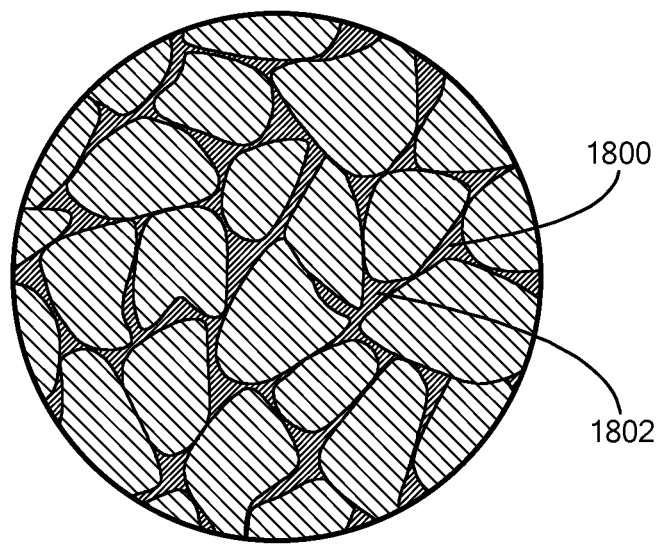

The product of the reaction may define voids, exemplified by voids 1700 and 1702, between grains, as shown schematically in FIG. 17. To fill these voids 1700-1702 while the two or more metals react to form the product, some or all the particles may include a fast-diffusing metal, such as Ag or Al, which reflows into the voids 1700-1702, as indicated at 1800 and 1802 in FIG. 18. The resulting product has fewer voids and is, therefore, less resistive and less prone to diffusion. The reflow metal may be included in the ink as particles separate from the particles that contain the reactive participants, or the reflow metal may be included, such as an additional layer, in the particles that include the reactive participants.

Although embodiments have been described in which two metals react to form a product, in other embodiments, a metal and a non-metal react to form the product, as long as the product is electrically conductive and has lower diffusivity than either of the materials that reacted. The metal may be one of Cu, Al, Ag, Au, Pd, Pt, Si, Ti, Zr, Rh, Ir, Os, Ta, Mg, Ru, Fe, Ni, Co and C or an oxide or nitride thereof. An example of a reaction in which a metal and a non-metal react to form a suitable product is $2Ta+N_2 \rightarrow 2TaN$.

Applications

Figure 19:
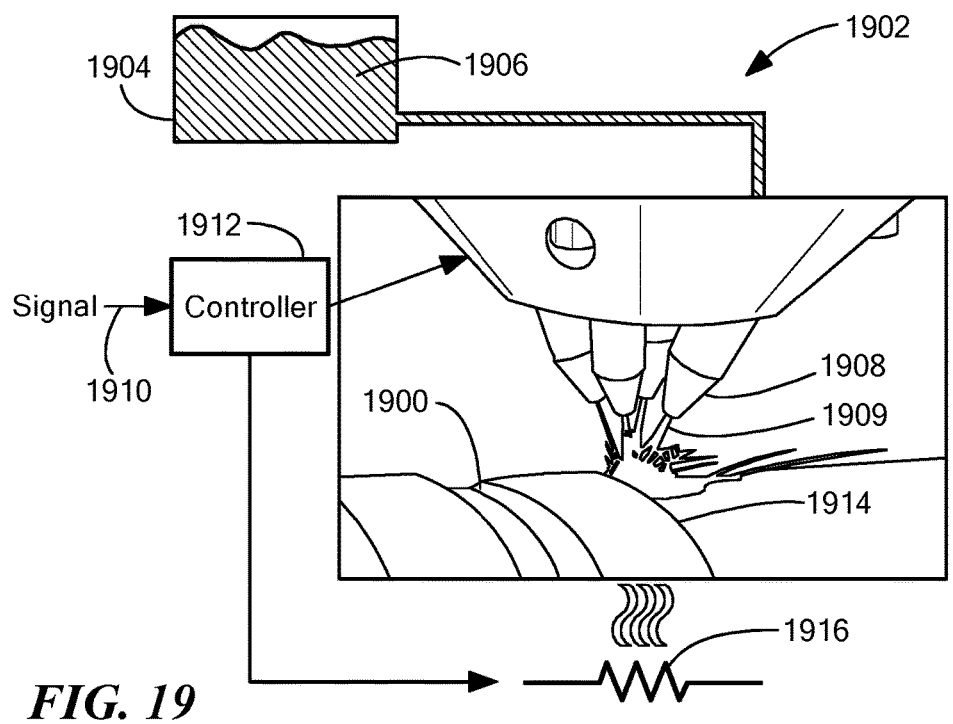
FIGS. 19 and 20 schematically illustrate ink being applied to respective substrates using inkjet printers, according to embodiments of the present invention.
Figure 20:
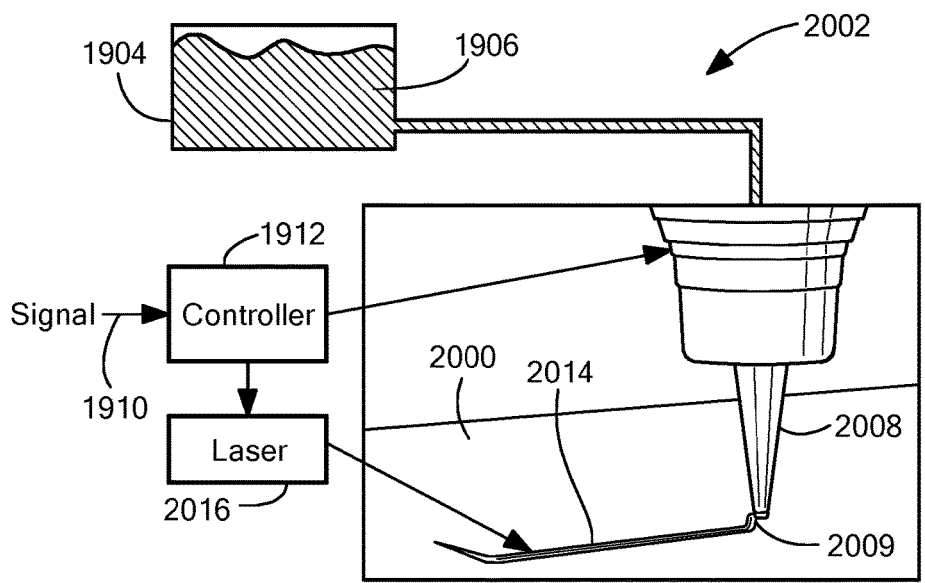

Inks described herein may be used with conventional inkjet printers or modified inkjet printers. FIGS. 19 and 20 illustrate ink being applied to respective substrates 1900 and 2000 using inkjet printers 1902 and 2002, according to embodiments of the present invention. FIG. 19 shows a portion of a 3D printer 1902 made by Optomec, Albuquerque, N. Mex., and FIG. 20 shows a portion of a 3D printer 2002 made by Voxel8, Somerville, Mass.

In each case, a reservoir 1904 contains ink 1906. The reservoir 1904 is in fluid communication with an ink jet 1908 or a nozzle 2008, respectively. The ink jet 1908 or nozzle 2008 is configured to spray droplets 1909 or extrude a line 2009, respectively, of the ink 1906 onto the substrate 1900 or 2000 in a pattern, according to an electronic signal 1910. A controller 1912 receives the signal 1910 and commands operation of components of the inkjet printer 1902 or 2002, such as movement of the ink jet 1908 or nozzle 2008 and/or movement of the substrate 1900 or 2000, so the ink jet 1908 or nozzle 2008 effectively raster or otherwise scans the substrate 1900 or 2000, at least where the ink should be deposited. The controller 1912 also controls spaying of the droplets 1909 or extruding of a line 2009 of ink 1906, according to the electronic signal 1910, to produce deposited ink 1914 or 2014 on the substrate 1900 or 2000. The droplets 1909 or line 2009 may, for example, be deposited on the substrate 1900 or 2000 in a pattern to create an electronic circuit.

An energy source is configured to heat the deposited ink 1914 or 2014 sufficiently to initiate a chemical reaction, to react the first metal in the deposited ink 1914 or 2014 to produce the product on the substrate 1900 or 2000, as described herein. In some embodiments, the controller 1912 controls the energy source. In some embodiments, the energy source may be a resistive heater, exemplified by resistive heater 1916. One or a relatively small number of resistive heaters 1916 may be disposed within the inkjet printer 1902 or 2002 to heat an area or volume in which the substrate 1900 or 2000 is disposed. Optionally, an array of resistive heaters 1916 may be disposed within the inkjet printer 1902 or 2002, and selective ones of the resistive heaters 1916 may be energized, so as to heat the deposited ink 1914 or 2014 only in areas of the substrate 1902 or 2002 where ink has been deposited. In other embodiments, once the ink has been deposited on the substrate 1900 or 2000, the substrate 1900 or 2000 may be moved to an oven to heat the deposited ink 1914 or 2014 to initiate the chemical reaction.

In some embodiments, a laser, exemplified by laser 2016 in FIG. 20, may be used as the energy source. The controller 1912 may scan the laser on the deposited ink 1914 or 2014, thus applying energy to the at least a portion of the deposited ink 1914 or 2014 on the substrate 1900 or 2000, without heating the entire substrate 1900 or 2000. Optionally or alternatively, an infrared (IR) heater or other suitable lamp (not shown) may be used instead of, or in addition to, the resistive heater 1916 and/or the laser 2016. Optionally or alternatively, an electric current, generated by the inkjet printer or by another device, may be passed through at least a portion of the deposited ink 1914 or 2014 to heat the deposited ink 1914 or 2014.

As described herein, an exemplary ink may include both the first metal and the other substance, with which the first metal reacts. However, in another embodiment, an ink kit includes two inks, i.e., a first ink, and a second ink separate from the first ink. The first ink includes the first metal, and the second ink includes the other substance. The two inks may be stored in separate reservoirs (not shown), and the two inks may be deposited on a common substrate 1900 or 2000 at the same time or one after the other. For example, separate inkjets 1908 or nozzles (not shown) may be used to simultaneously or serially spray droplets of each of the two inks, or a valve (not shown) may be used to select one, and then the other, of the two inks to be deposited by a single inkjet 1908 or nozzle 2008. The ink kit may be considered to be a two-part ink.

These inks may be used to produce metallic systems capable of performing as electrically conductive elements in an electric circuit, including printing conductors for mid- to high-power applications, such as cars, appliances or house wiring, where copper wiring is used today. These inks may be used in resource-denied environments, such as by warfighters in the field needing to repair electronics, satellites in space needing to self-repair or self-modify hardware, rovers on Mars building custom circuits, submarines repairing systems without docking and people needing to develop a product in a timely fashion. These inks may also be used to repurpose or reuse electronic components, such as to reduce the number of electronics discarded in landfills, and to permit timely system engineering of recovered components.

Figure 21A:
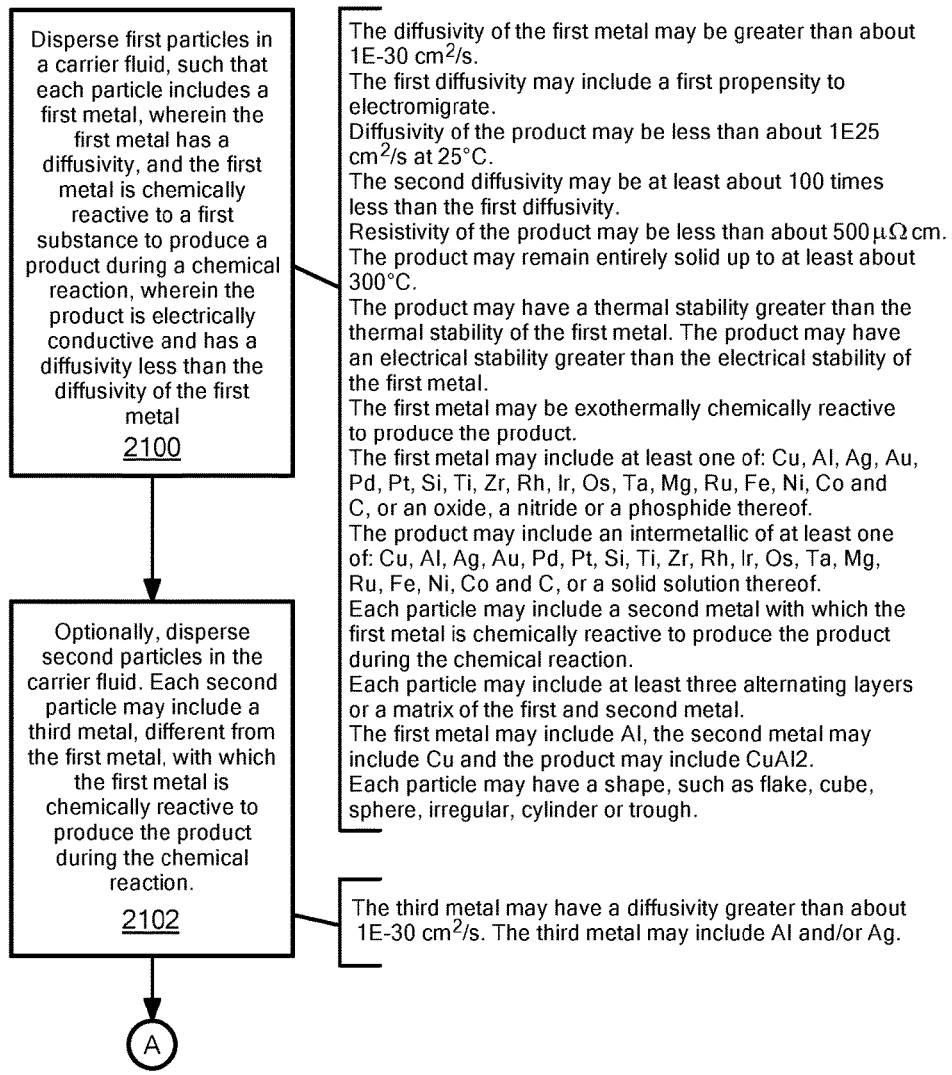
FIGS. 21a and 21b collectively contain a flowchart schematically illustrating operations of a method for making an ink, according to an embodiment of the present invention.
Figure 21B:
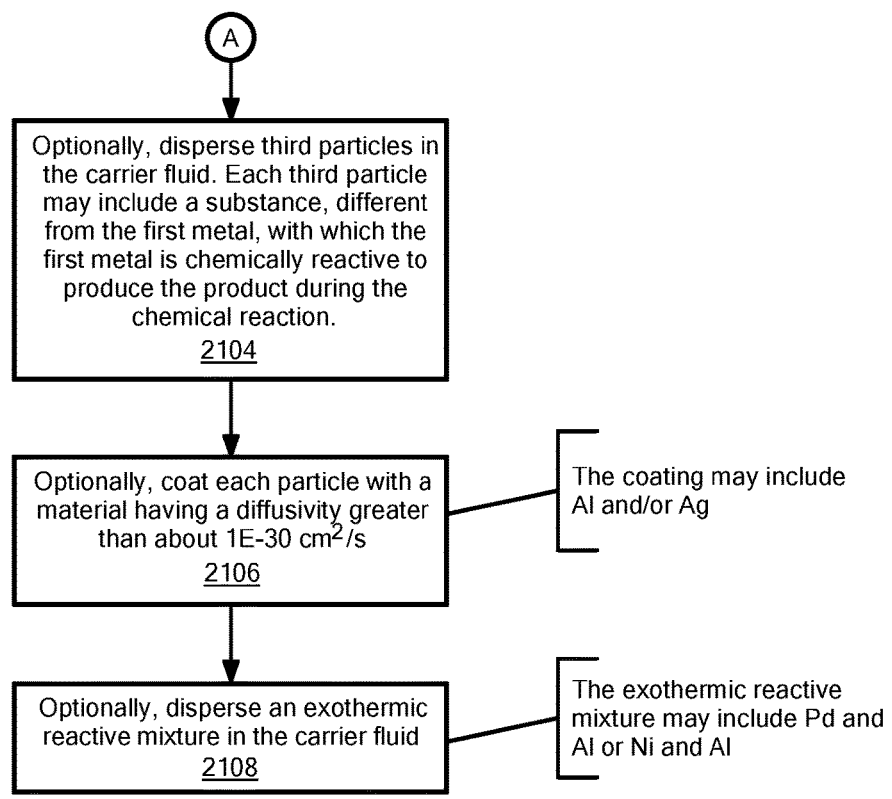

FIGS. 21a and 21b collectively contain a flowchart schematically illustrating operations of a method for making an ink, according to an embodiment of the present invention. At 2100, first particles are dispersed in a carrier fluid, such that each particle includes a first metal. The first metal has a diffusivity, and the first metal is chemically reactive to a first substance to produce a product during a chemical reaction. The product is electrically conductive and has a diffusivity less than the diffusivity of the first metal.

The diffusivity of the first metal may be greater than about $1E-30$ cm$^2$/s. The first diffusivity may include a first propensity to electromigrate. Diffusivity of the product may be less than about $1E-25$ cm$^2$/s at $25°$ C. The second diffusivity may be at least about 100 times less than the first diffusivity. Resistivity of the product may be less than about 500 µΩ-cm. The product may remain entirely solid up to at least about 300° C. The product may have a thermal stability greater than the thermal stability of the first metal. The product may have an electrical stability greater than the electrical stability of the first metal.

The first metal may be exothermally chemically reactive to produce the product. The first metal may include at least one of: Cu, Al, Ag, Au, Pd, Pt, Si, Ti, Zr, Rh, Ir, Os, Ta, Mg, Ru, Fe, Ni, Co and C, or an oxide, a nitride or a phosphide thereof. The product may include an intermetallic of at least one of: Cu, Al, Ag, Au, Pd, Pt, Si, Ti, Zr, Rh, Ir, Os, Ta, Mg, Ru, Fe, Ni, Co and C, or a solid solution thereof. Each particle may include a second metal with which the first metal is chemically reactive to produce the product during the chemical reaction. Each particle may include at least three alternating layers or a matrix of the first and second metal. The first metal may include Al, the second metal may include Cu and the product may include $CuAl_2$. Each particle may have a shape, such as flake, cube, sphere, irregular, cylinder or trough.

Optionally, at 2102, second particles are dispersed in the carrier fluid. Each second particle may include a third metal, different from the first metal, with which the first metal is chemically reactive to produce the product during the chemical reaction. The third metal may have a diffusivity greater than about 1E-30 cm$^2$/s at 25° C. The third metal may include Al and/or Ag.

Optionally, at 2104, third particles are dispersed in the carrier fluid. Each third particle may include a substance, different from the first metal, with which the first metal is chemically reactive to produce the product during the chemical reaction.

Optionally, at 2106, each particle is coated with a material having a diffusivity greater than about 1E-30 cm$^2$/s at 25° C. The coating may include Al and/or Ag.

Optionally, at 2108, an exothermic reactive mixture is dispersed in the carrier fluid. The exothermic reactive mixture may include Pd and Al or Ni and Al.

Figure 22:
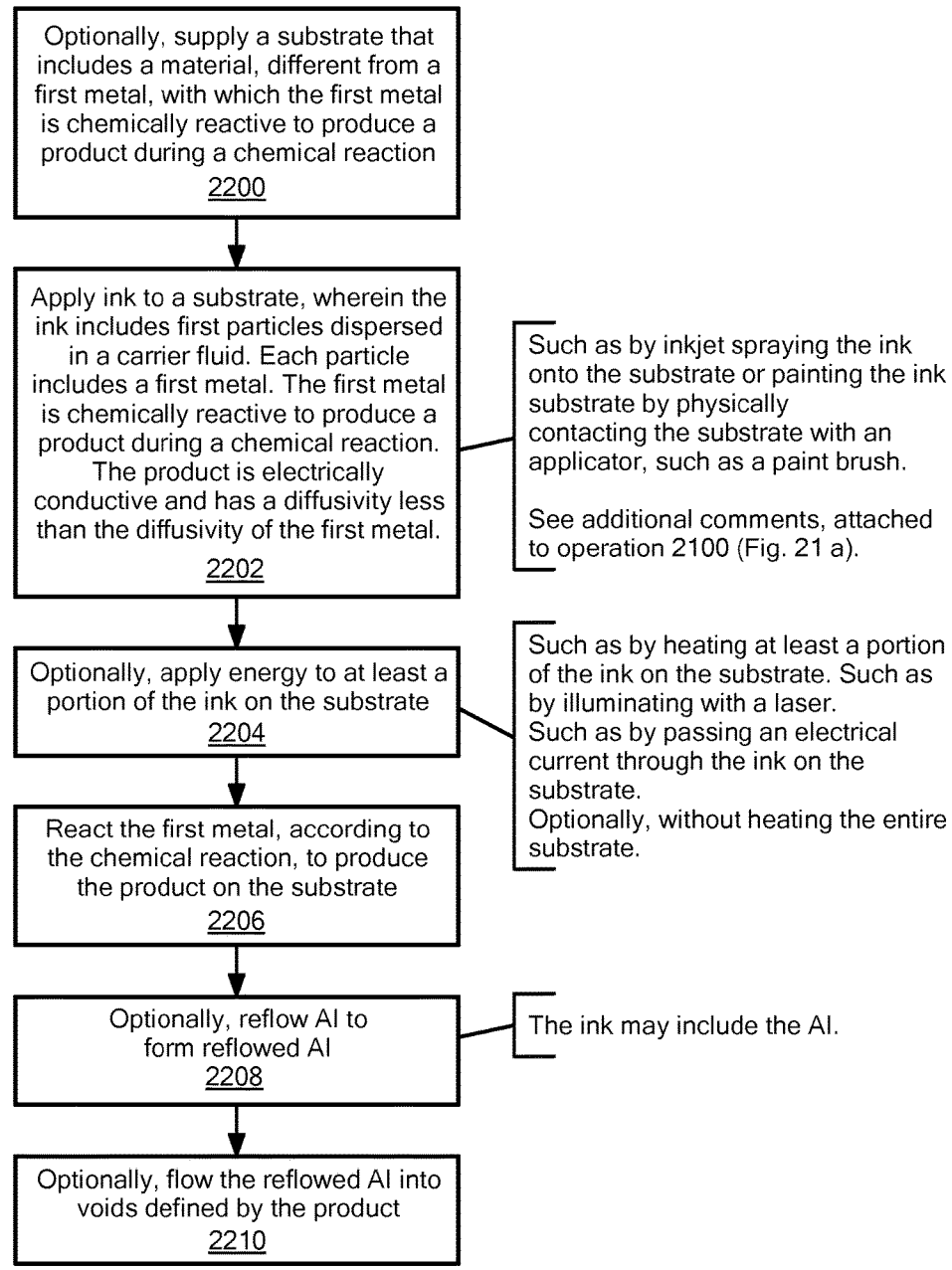
FIG. 22 is a flowchart schematically illustrating operations of a method for fabricating an electric conductor, according to an embodiment of the present invention.

FIG. 22 is a schematic flowchart schematically illustrating operations of a method for fabricating an electric conductor, according to an embodiment of the present invention. Optionally, at 2200, a substrate is supplied. The substrate includes a material, different from a first metal, with which the first metal is chemically reactive to produce a product during a chemical reaction.

At 2202, ink is applied to the substrate. The ink includes first particles dispersed in a carrier fluid. Each particle includes a first metal. The first metal is chemically reactive to produce the product during the chemical reaction. The product is electrically conductive and has a diffusivity less than the diffusivity of the first metal.

The ink may be applied by inkjet spraying the ink onto the substrate or painting the ink onto the substrate by physically contacting the substrate with an applicator, such as a paint brush. See additional comments, relative to operation 2100 (FIG. 21a).

Optionally at 2204, energy may be applied to at least a portion of the ink on the substrate. The energy may be applied by heating at least a portion of the ink on the substrate, such as by illuminating the deposited ink with a laser or other suitable lamp, heating the substrate in an oven, or passing an electrical current through the ink on the substrate, thereby resistively heading the ink. The ink on the substrate may be heated without heating the entire substrate.

At 2206, the first metal is reacted, according to the chemical reaction, to produce the product on the substrate.

The ink may include Al. Optionally, at 2208, the Al reflows to form reflowed Al. Optionally, at 2210, the reflowed Al flows into voids defined by the product.

While the invention is described through the above-described exemplary embodiments, modifications to, and variations of, the illustrated embodiments may be made without departing from the inventive concepts disclosed herein. For example, although specific parameter values, such as dimensions, temperatures, conductivities, resistivities, diffusivities and materials, may be recited in relation to disclosed embodiments, within the scope of the invention, the values of all parameters may vary over wide ranges to suit different applications. Unless otherwise indicated in context, or would be understood by one of ordinary skill in the art, terms such as "about" mean within ±20%.

As used herein, including in the claims, the term "and/or," used in connection with a list of items, means one or more of the items in the list, i.e., at least one of the items in the list, but not necessarily all the items in the list. As used herein, including in the claims, the term "or," used in connection with a list of items, means one or more of the items in the list, i.e., at least one of the items in the list, but not necessarily all the items in the list. "Or" does not mean "exclusive or."

Although aspects of embodiments may be described with reference to flowcharts and/or block diagrams, functions, operations, decisions, etc. of all or a portion of each block, or a combination of blocks, may be combined, separated into separate operations or performed in other orders.

Disclosed aspects, or portions thereof, may be combined in ways not listed above and/or not explicitly claimed. In addition, embodiments disclosed herein may be suitably practiced, absent any element that is not specifically disclosed herein. Accordingly, the invention should not be viewed as being limited to the disclosed embodiments.

What is claimed is:

1. An ink comprising:
   a plurality of particles dispersed in a carrier fluid, wherein:
   at least some of the particles comprise a first metal having a first metal diffusivity; and
   at least some of the particles comprise a substance that is chemically reactive with the first metal in a chemical reaction, such that the chemical reaction produces a product that is electrically conductive and has a product diffusivity, and the product diffusivity is less than the first metal diffusivity.

2. An ink according to claim 1, wherein the at least some of the particles that comprise the first metal also comprise the substance.

3. An ink according to claim 1, wherein the at least some of the particles that comprise the first metal are distinct from the at least some of the particles that comprise the substance.

4. An ink according to claim 1, wherein the first metal diffusivity is greater than about 1E-30 cm$^2$/s at 25° C.

5. An ink according to claim 1, wherein the first metal diffusivity comprises a first propensity to electromigrate.

6. An ink according to claim 1, wherein the product diffusivity is less than about 1E-25 cm$^2$/s at 25° C.

7. An ink according to claim 1, wherein the product diffusivity is at least about 100 times less than the first diffusivity.

8. An ink according to claim 1, wherein resistivity of the product is less than about 500 μΩ-cm.

9. An ink according to claim 1, wherein the product remains entirely solid up to at least about 300° C.

10. An ink according to claim 1, wherein:

the first metal has a thermal stability;
the product has a thermal stability greater than the thermal stability of the first metal;
the first metal has an electrical stability; and
the product has an electrical stability greater than the electrical stability of the first metal.

11. An ink according to claim 1, wherein the chemical reaction is exothermic.

12. An ink according to claim 1, wherein the first metal comprises:
   Cu, Al, Ag, Au, Pd, Pt, Si, Ti, Zr, Rh, Ir, Os, Ta, Mg, Ru, Fe, Ni, Co and/or C; and/or
   an oxide of Cu, Al, Ag, Au, Pd, Pt, Si, Ti, Zr, Rh, Ir, Os, Ta, Mg, Ru, Fe, Ni, Co and/or C; and/or
   a nitride of Cu, Al, Ag, Au, Pd, Pt, Si, Ti, Zr, Rh, Ir, Os, Ta, Mg, Ru, Fe, Ni, Co and/or C; and/or
   a phosphide of Cu, Al, Ag, Au, Pd, Pt, Si, Ti, Zr, Rh, Ir, Os, Ta, Mg, Ru, Fe, Ni, Co and/or C.

13. An ink according to claim 1, wherein the product comprises:
   an intermetallic of Cu, Al, Ag, Au, Pd, Pt, Si, Ti, Zr, Rh, Ir, Os, Ta, Mg, Ru, Fe, Ni, Co and/or C; and/or
   a solid solution of Cu, Al, Ag, Au, Pd, Pt, Si, Ti, Zr, Rh, Ir, Os, Ta, Mg, Ru, Fe, Ni, Co and/or C.

14. An ink according to claim 1, wherein the substance comprises a second metal, different from the first metal.

15. An ink according to claim 14, wherein the first metal comprises Al, the second metal comprises Cu and the product comprises $CuAl_2$.

16. An ink according to claim 1, wherein the substance comprises a non-metal.

17. An ink kit comprising:
   a first ink comprising a plurality of first particles dispersed in a first carrier fluid, wherein each first particle of the plurality of first particles comprises a first metal having a first metal diffusivity; and
   a second ink, separate from the first ink, the second ink comprising a plurality of second particles dispersed in a second carrier fluid, each second particle of the plurality of second particles comprising a substance that is chemically reactive with the first metal in a chemical reaction, such that the chemical reaction produces a product that is electrically conductive and has a product diffusivity, and the product diffusivity is less than the first metal diffusivity.

18. A method for fabricating an electric conductor, the method comprising:
   applying an ink to a substrate, the ink comprising a plurality of particles dispersed in a carrier fluid, wherein:
      at least some of the particles comprise a first metal having a first metal diffusivity; and
      at least some of the particles comprise a substance that is chemically reactive with the first metal in a chemical reaction, such that the chemical reaction produces a product that is electrically conductive and has a product diffusivity, and the product diffusivity is less than the first metal diffusivity; and
   reacting the first metal with the substance, according to the chemical reaction, to produce the product on the substrate.

19. A method for fabricating an electric conductor, the method comprising:
   applying a first ink to a substrate, the first ink comprising a plurality of first particles dispersed in a first carrier fluid, wherein each first particle of the plurality of first particles comprises a first metal having a first metal diffusivity;
   applying a second ink to the substrate, distinct from the first ink, the second ink comprising a plurality of second particles dispersed in a second carrier fluid, each second particle of the plurality of second particles comprising a substance that is chemically reactive with the first metal in a chemical reaction, such that the chemical reaction produces a product that is electrically conductive and has a product diffusivity, and the product diffusivity is less than the first metal diffusivity; and
   reacting the first metal with the substance, according to the chemical reaction, to produce the product on the substrate.

* * * * *